US009442241B2

(12) United States Patent
Morgan et al.

(10) Patent No.: US 9,442,241 B2
(45) Date of Patent: Sep. 13, 2016

(54) OPTICS FOR ILLUMINATION DEVICES

(71) Applicant: Morgan Solar Inc., Toronto (CA)

(72) Inventors: John Paul Morgan, Toronto (CA); Michael Sinclair, Toronto (CA); Nigel Morris, Toronto (CA); Pascal Dufour, Toronto (CA)

(*) Notice: Subject to any disclaimer, the term of this patent is extended or adjusted under 35 U.S.C. 154(b) by 0 days.

(21) Appl. No.: 14/213,004

(22) Filed: Mar. 14, 2014

(65) Prior Publication Data

US 2014/0268871 A1    Sep. 18, 2014

Related U.S. Application Data

(60) Provisional application No. 61/794,610, filed on Mar. 15, 2013.

(51) Int. Cl.
*F21V 8/00* (2006.01)
*G02B 19/00* (2006.01)
(Continued)

(52) U.S. Cl.
CPC .............. *G02B 6/005* (2013.01); *F24J 2/067* (2013.01); *F24J 2/08* (2013.01); *G02B 19/0028* (2013.01); *G02B 19/0042* (2013.01);
(Continued)

(58) Field of Classification Search
CPC .. G02B 6/0053; G02B 3/005; G02B 6/0016; G02B 6/0036; G02B 6/0038; G02B 6/0073; G02B 27/2214; G02B 3/0068; G02B 6/0018; G02B 6/0028; G02B 6/0031; G02B 6/0046; G02B 6/0055; G02B 5/045; G02B 6/0045; G02B 19/0047; G02B 19/0061; G02B 6/0015; G02B 6/005; G02F 2001/133607; G02F 1/133603; G02F 1/133605; G02F 1/13361; G02F 2001/1336; F24J 2/067; F24J 2/08; F24J 2/085
USPC ....... 362/326, 327, 330, 333, 336, 337, 606, 362/607, 610–613, 615–617, 619, 620, 623, 362/625, 626; 385/33
See application file for complete search history.

(56) References Cited

U.S. PATENT DOCUMENTS

| 6,130,730 A | 10/2000 | Jannson et al. |
| 6,667,782 B1 | 12/2003 | Taira et al. |

(Continued)

FOREIGN PATENT DOCUMENTS

| WO | 2009063416 | 5/2009 |
| WO | 2010033859 | 3/2010 |

(Continued)

OTHER PUBLICATIONS

Unger, "Dimpled Planar Lightguide Solar Concentrators", Submitted in Partial Fulfillment of the Requirements for the Degree of Doctor of Philosophy, The Institute of Optics Arts, Sciences and Engineering, University of Rochester, 2010.

(Continued)

*Primary Examiner* — Hargobind S Sawhney
(74) *Attorney, Agent, or Firm* — Dimock Stratton LLP

(57) ABSTRACT

Optics are provided for use in illumination devices the optics having a light guide, a redirecting layer including a plurality of lenses, and a plurality of reflector elements. Light from a light source enters the light guide and is guided therein until it escapes into a reflector element, which reflects at least some of the light received by the reflector element toward a corresponding lens for emission from the illumination device.

17 Claims, 25 Drawing Sheets

(51) Int. Cl.
  *H01L 31/054* (2014.01)
  *F24J 2/06* (2006.01)
  *F24J 2/08* (2006.01)
(52) U.S. Cl.
  CPC ........ *H01L 31/054* (2014.12); *H01L 31/0543* (2014.12); *Y02E 10/40* (2013.01); *Y02E 10/52* (2013.01)

(56) References Cited

U.S. PATENT DOCUMENTS

| | | |
|---|---|---|
| 7,371,001 B2 | 5/2008 | Miyashita |
| 7,391,939 B1 | 6/2008 | Williams |
| 7,530,721 B2 | 5/2009 | Mi et al. |
| 7,664,350 B2 | 2/2010 | Ghosh et al. |
| 7,672,549 B2 | 3/2010 | Ghosh et al. |
| 7,806,547 B2 | 10/2010 | Benitez et al. |
| 7,817,885 B1 | 10/2010 | Moore et al. |
| 7,855,763 B2* | 12/2010 | Yuuki et al. ............ 349/62 |
| 7,946,286 B2 | 5/2011 | Raymond et al. |
| 7,991,257 B1 | 8/2011 | Coleman |
| 7,991,261 B2 | 8/2011 | Morgan |
| 8,066,408 B2 | 11/2011 | Rinko |
| 8,152,339 B2 | 4/2012 | Morgan |
| 8,189,970 B2 | 5/2012 | Moore et al. |
| 8,189,973 B2 | 5/2012 | Travis et al. |
| 8,506,148 B2* | 8/2013 | Shimizu ............ 362/606 |
| 8,899,815 B2* | 12/2014 | Chen et al. ............ 362/619 |
| 8,917,447 B2* | 12/2014 | Wolk et al. ............ 359/452 |
| 2005/0146897 A1* | 7/2005 | Mimura ............ G02B 6/0053 362/623 |
| 2007/0002583 A1* | 1/2007 | Lee et al. ............ 362/606 |
| 2009/0064993 A1 | 3/2009 | Ghosh et al. |
| 2009/0067784 A1 | 3/2009 | Ghosh et al. |
| 2009/0126792 A1 | 5/2009 | Gruhlke et al. |
| 2009/0196069 A1* | 8/2009 | Iwasaki ............ G02B 6/0041 362/613 |
| 2010/0002169 A1 | 1/2010 | Kuramitsu et al. |
| 2010/0037954 A1 | 2/2010 | Thony |
| 2010/0108124 A1 | 5/2010 | Knox et al. |
| 2010/0110720 A1 | 5/2010 | Cennini et al. |
| 2010/0116319 A1 | 5/2010 | Martinez Anton et al. |
| 2010/0278480 A1 | 11/2010 | Vasylyev |
| 2011/0203662 A1 | 8/2011 | Miñano et al. |
| 2012/0092772 A1 | 4/2012 | Salomon |
| 2012/0127573 A1 | 5/2012 | Robinson et al. |

FOREIGN PATENT DOCUMENTS

| | | |
|---|---|---|
| WO | 2010124028 | 10/2010 |
| WO | 2012075384 | 6/2012 |

OTHER PUBLICATIONS

Karp et al, "Planar micro-optic solar concentrator", Optics Express, vol. 19, No. 2, Jan. 18, 2010.

* cited by examiner

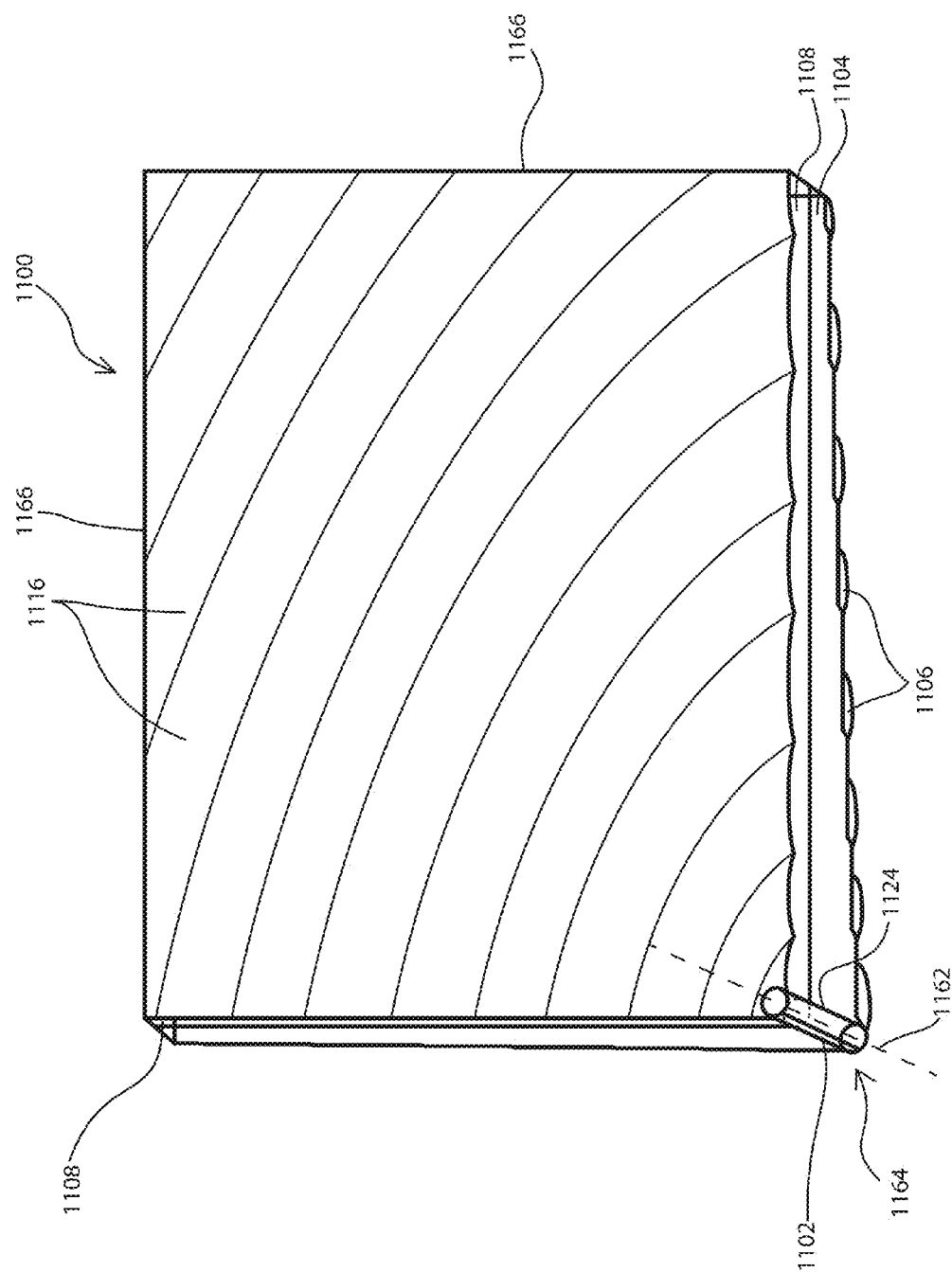

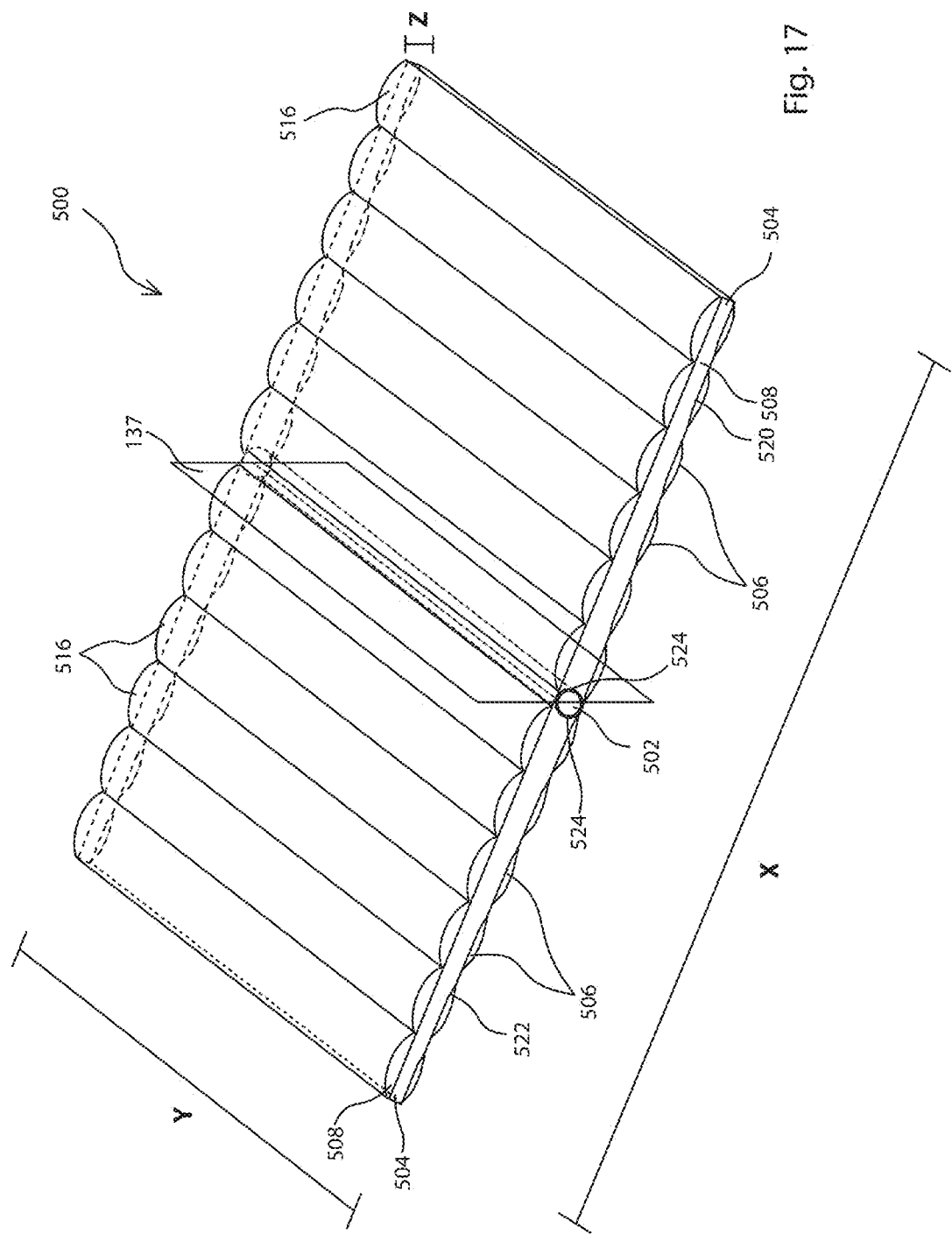

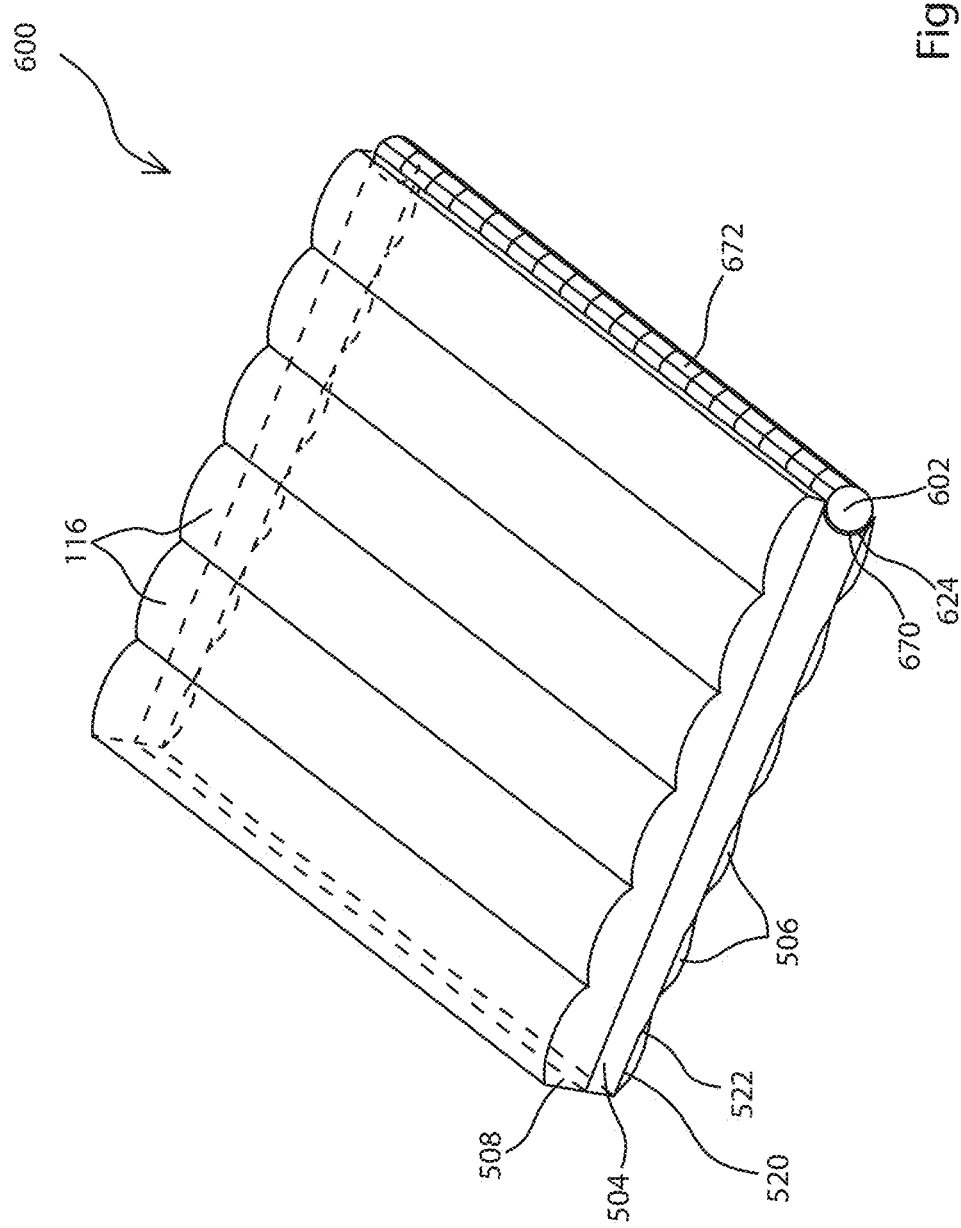

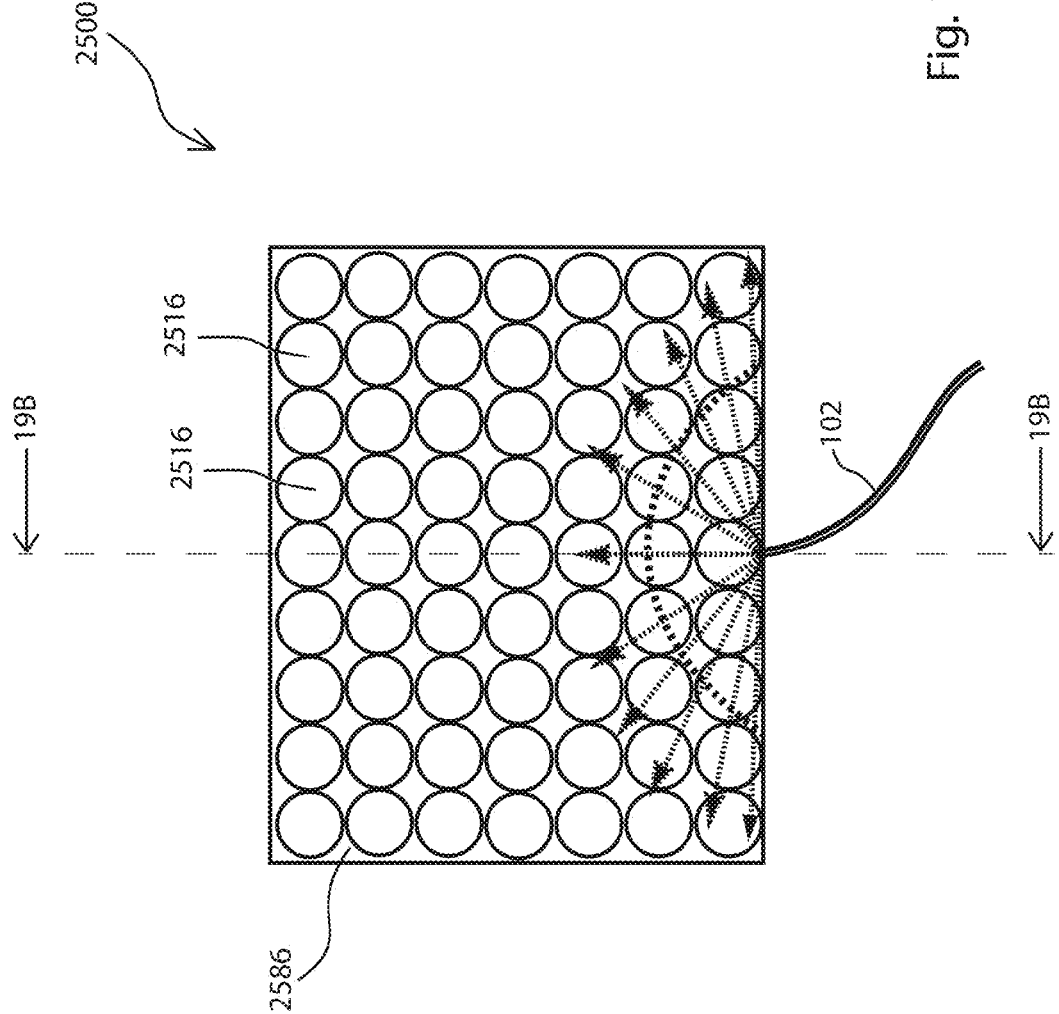

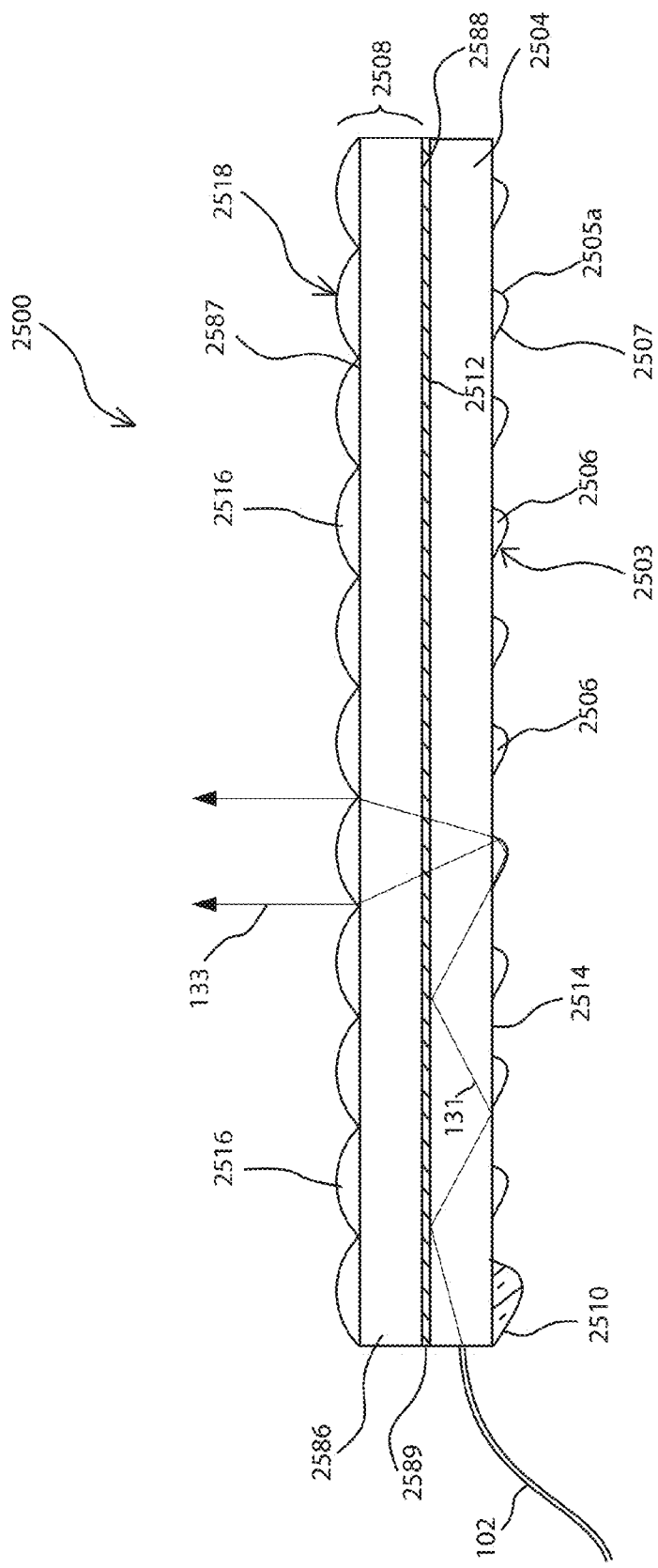

OPTICS FOR ILLUMINATION DEVICES

FIELD OF THE INVENTION

The present invention relates to optics.

BACKGROUND

Optics can also be used in illumination devices to collimate or otherwise direct light from a light source.

Depending on the application, optics for use in illumination devices can be selected for the degree of collimation, the depth of the fixture or the size of the light source used. Such optics may consist of optical elements such as lenses or reflective surfaces to direct the light. The light source is often an incandescent bulb, fluorescent bulb or a light emitting diode.

Light is typically emitted from the light source in all or most directions and interacts with the optical elements such that the light is redirected to form a beam in which all the rays of light are substantially parallel or diverge from the illumination device.

One widespread application for illumination devices is automotive headlamps. In a typical automotive headlamp, a bulb is positioned at the focal point of a parabolic reflector. Light emanates from the bulb in all directions and some of the light impinges upon the parabolic reflector, which collimates the light into a beam. The typical automotive headlamp also has a lens for dispersing the collimated light. In general these automotive headlamps have considerable depth, occupying space in the car. Other exemplary applications include products such as, amongst others, stage lighting, flashlights, medical lighting and dentistry lighting.

An efficient illumination device emits a large percentage of the light output by the light source in the desired direction. The design of the optic within an illumination device can affect the size of the device, the ease of manufacture and the device's stability over time.

Therefore, a slim-profile optic that provides directed light in a highly efficient manner is desirable for use in an illumination device.

BRIEF DESCRIPTION OF THE DRAWINGS

For a better understanding of the present invention, as well as other aspects and further features thereof, reference is made to the following description which is to be used in conjunction with the accompanying drawings, where:

FIG. 16 is a perspective view of an embodiment of a cropped illumination device;

FIG. 17 is a perspective view of an embodiment of an illumination device having the general shape of a planar cuboid with symmetry about a central plane;

FIG. 18 is a perspective view of an embodiment of an illumination device having the general shape of a planar cuboid with a light source along an edge of the light guide;

FIG. 19A is a plan view of an embodiment of an illumination device that have an array of lens-reflector element pairs;

FIG. 19B is a cross-sectional view of the illumination device of FIG. 19A taken along line 19B-19B;

DETAILED DESCRIPTION

Figure 1:
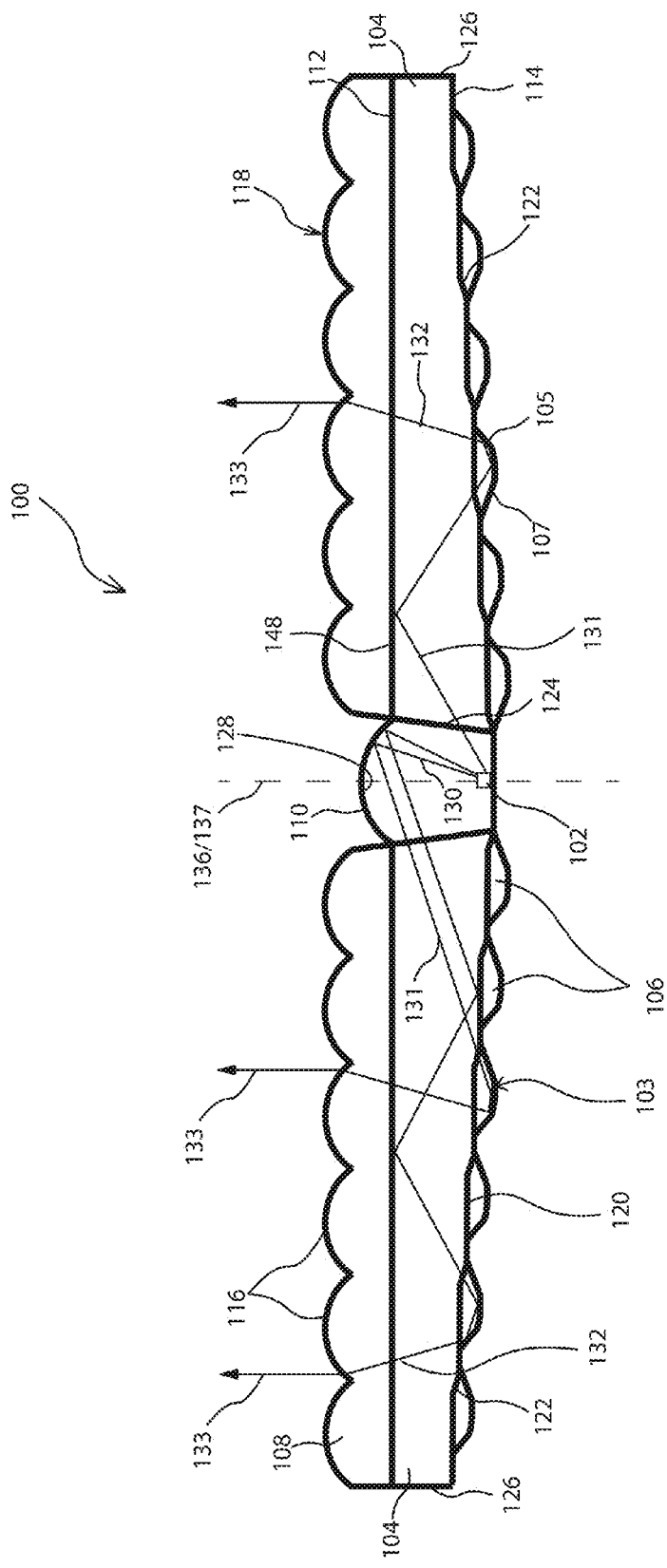
FIG. 1 is a cross-sectional view of an embodiment of an illumination device.

Referring to FIG. 1, there is shown a cross section of an illumination device 100 including a light guide 104, a plurality of reflector elements 106 and a redirecting layer 108. The light guide 104 is made of a light transmissive material such as glass, polycarbonate or injection molded poly(methyl methacrylate) (PMMA). Other non-limiting examples of light transmissive materials that may be used include injection molded polymethyl methacrylimide (PMMI), Cyclo Olefin Polymers (COP), Cyclo Olefin Copolymers (COC), silicones and other light transmissive polymeric materials. The light guide 104 is wedge-shaped in cross section and includes a first surface 112 and a second surface 114. The second surface 114 includes a plurality of step portions 120 adjacent to a plurality of inter-step portions 122.

In the embodiment shown in FIG. 1, the redirecting layer 108 has an output surface 118, a plurality of plano-convex lenses 116 that are adjacent to one another, and a planar surface 148 for coupling light from the light guide 104. Alternatively, other types of positive lenses, whether simple or complex, may be used. The redirecting layer 108 can be overmolded onto the first surface 112 of the light guide 104 or alternatively bonded thereto with an optical adhesive or by laser welding.

The plurality of reflector elements 106 can include flat, parabolic, analytical or free-form (e.g. non-uniform rational B-spline (NURBS)) reflective surfaces 103, or a combination thereof to redirect light 131 received via the inter-step portions 122 toward the lenses 116. For example, each reflector element 106 may comprise, in cross-section, a first portion 105 and a second portion 107. In cross-section the first portion 105 may be flat or slightly curved (convex or concave) and the second portion 107 may be an elongated curve. The first portion 105 and the second portion 107 are designed to cooperate in such a manner that light received by the second portion 107 via the inter-step portion 122 is reflected toward the first portion 105, which in turn reflects the light toward a corresponding lens 116 over a broad range of angles such that the output light 133 is substantially collimated. Some light 131 transmitted through the inter-step portion 122 may also be received directly by the first portion 105, which similarly reflects the received light toward the lens 116.

The plurality of reflector elements 106 can be overmolded onto the second surface 114 or alternatively bonded thereto, for example with an optical adhesive or by laser welding. The redirecting layer 108 and the plurality of reflector elements 106 are made of light transmissive materials, such as a silicone of lower refractive index than the material of the light guide 104. The illumination device 100 can be flexible where flexible materials are used, e.g., where the light guide 104 is made of, a high refractive index, deformable silicone.

Light 130 from a light source 102 may be coupled into the light guide 104, at least in part, by means of a light conditioning element 110. Some of the light 130 from the light source may enter the light guide 104 directly. The light conditioning element 110 may have the shape of a dome and have a reflective coating 128. The light conditioning element 110 can be made of metal or any other suitable material manufactured in the shape of a dome, attachable to the light guide 104, and coated on the concave side of the dome with a reflective material. In one embodiment, the light conditioning element 110 can be an optically transmissive element integrally formed (such as by injection molding as a single piece) with the light guide 104 and coated on the convex side of the dome with a reflective material. The reflective coating 128 can be made of a dielectric, or metals such as aluminum or silver. The light source 102 can be the terminus of an optical fibre 102 which transmits light from a remote, originating light source. In other embodiments the light source can be solid state lighting (SSL), such as a light-emitting diode (LED) or an organic light-emitting diode (OLED), a plasma light bulb, fluorescent light bulbs or any other type of suitable light-source.

Light 131 enters the light guide 104 through a light coupling surface 124 either directly (e.g., where the light emitted from the light source need not be reflected by the light conditioning element 110), or after having been reflected by the light conditioning element 110. Where the light conditioning element 110 and the light guide 104 are integrally formed, the light conditioning element 110 can have a cavity into which the light source can be inserted. Where the light conditioning element 110 and the light guide 104 are two separate pieces, the light source can be held in place by means of a clamp or a tray (not shown).

In the light guide 104, at least some of the light 131 is totally internally reflected by the first surface 112 and the step portions 120 of the second surface 114, and travels towards the peripheral edge 126 of the light guide 104. This light 131 eventually encounters an inter-step portion 122 of the second surface 114 and travels therethrough into a reflector element 106. Light 131 that enters the reflector element 106 via the inter-step portion 122 is then reflected by the surfaces of the reflector element 106 via total internal reflection (TIR) or, where the reflective surface 107 of the reflector element 106 is coated with a reflective material, by specular reflection. The reflected light 132 is redirected away from the reflector element 106 and is transmitted towards a corresponding lens 116 in the redirecting layer 108. The lens 116 may collimate the output light 133. In embodiments of the illumination device where the output light 133 need not be directed, a redirecting layer 108 may not be required.

Figure 5:
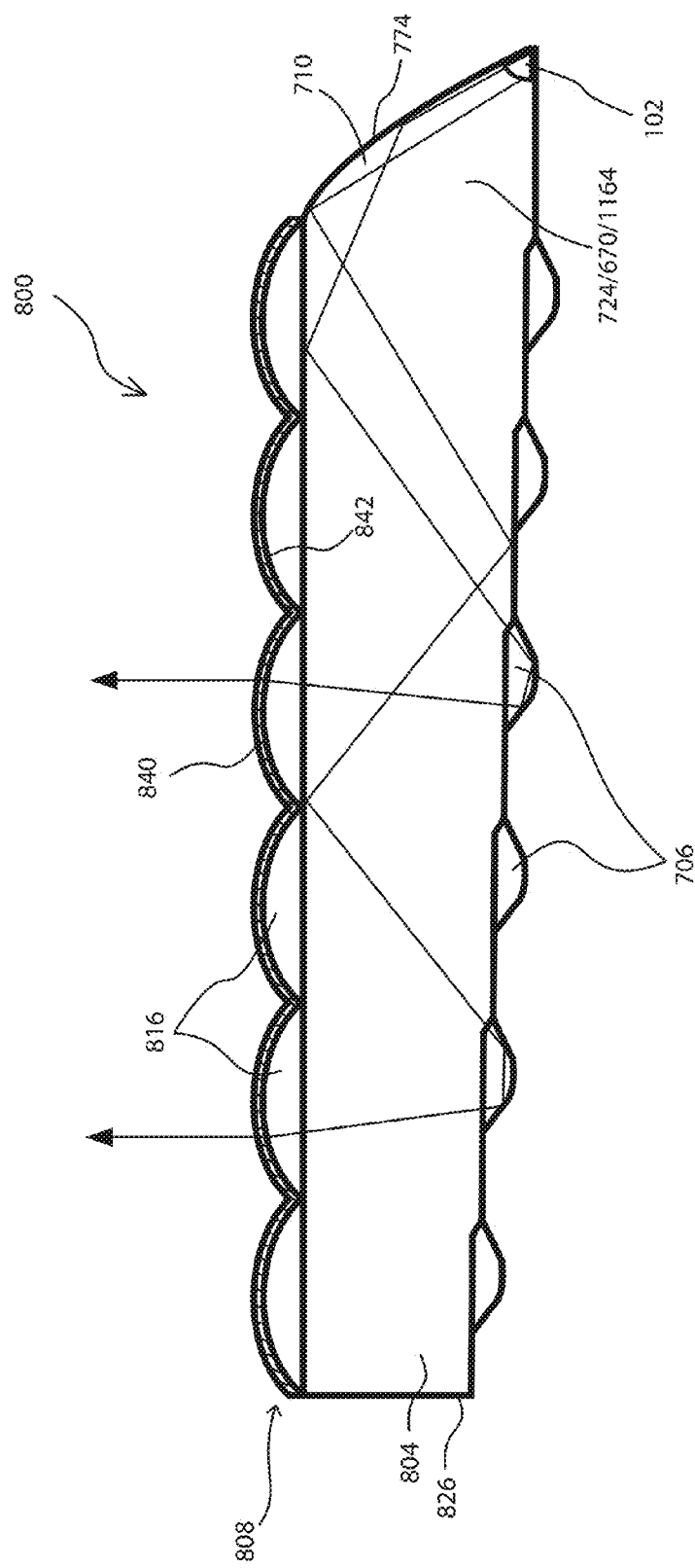
FIG. 5 is a cross-sectional view of an embodiment of an illumination device having a protective coating.
Figure 6:
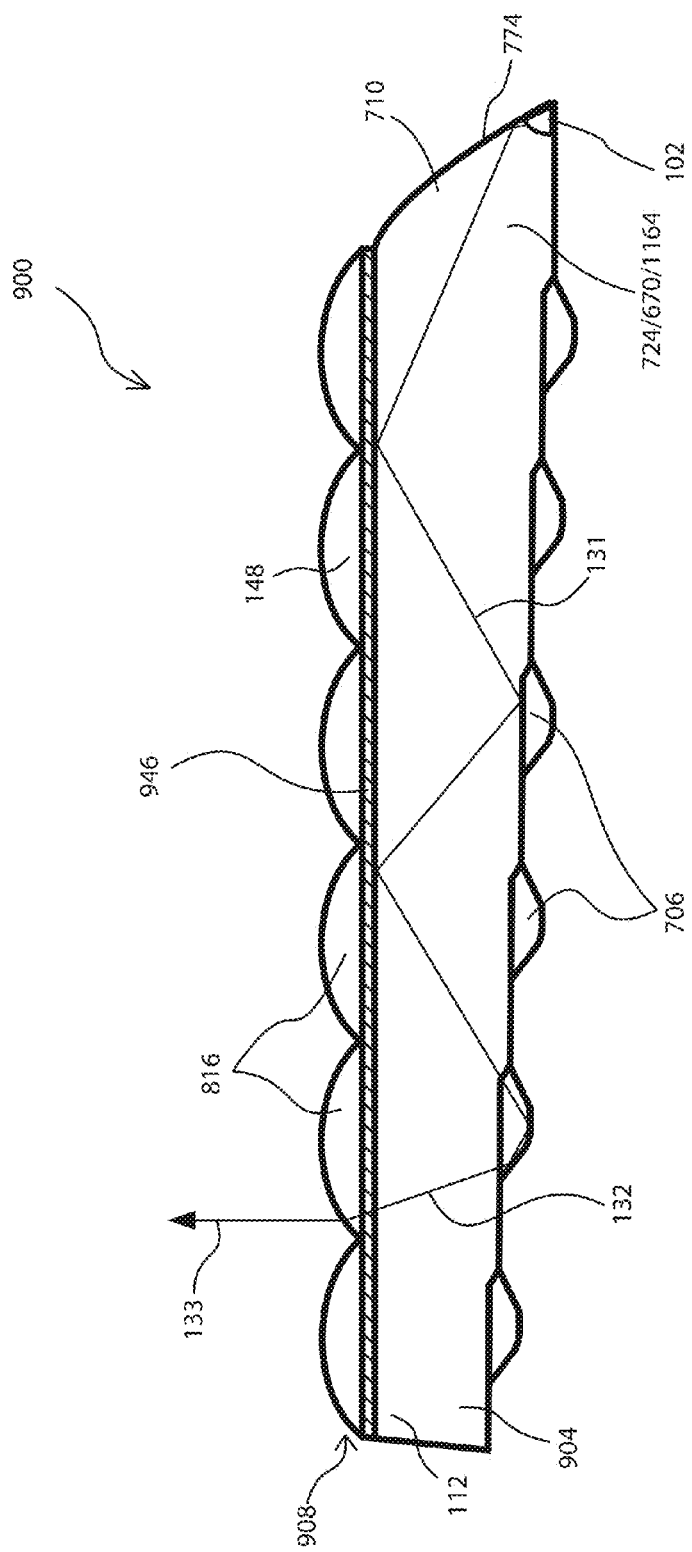
FIG. 6 is a cross-sectional view of an embodiment of an illumination device having an optical coupling layer between the light guide and the redirecting layer.
Figure 15:
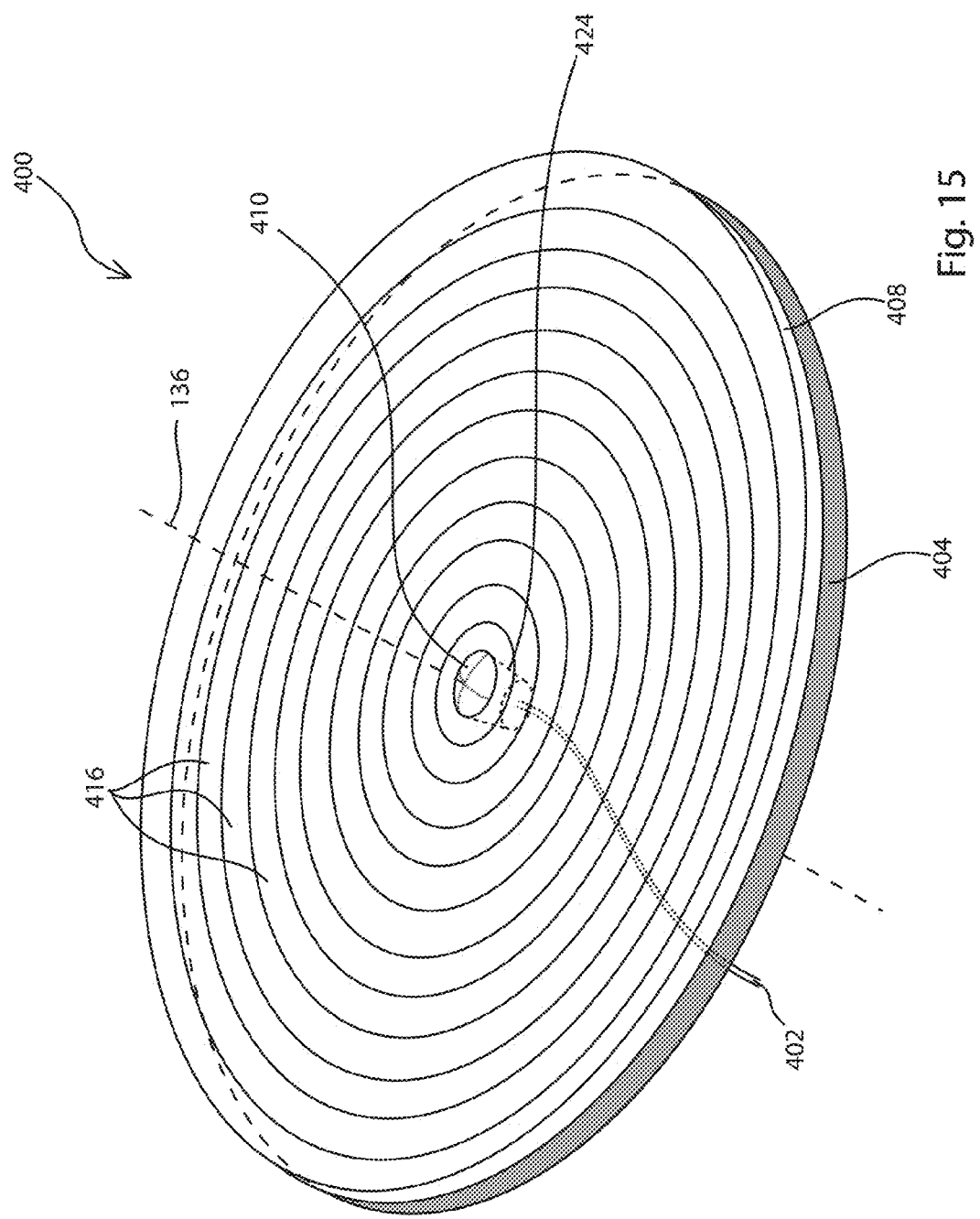
FIG. 15 is a perspective view of an embodiment of an illumination device having the general shape of a circular disk.

In one embodiment, the illumination device 100 can be generally in the shape of a circular disk (i.e., is discoid), being revolved around a central axis 136 such that in plan view, the optically active elements (reflector elements 106, step portions 120, inter-step portions 122, and lenses 116) follow concentric circles of increasing diameter from the central axis 136 to the peripheral edge 126 (an example of which is shown in FIG. 15). In another embodiment, the illumination device 100 can be generally in the shape of a planar cuboid, being linearly symmetrical about a central plane 137, such that when viewed from above, the optically active elements (reflector elements 106, step portions 120, inter-step portions 122, and lenses 116) follow straight, parallel lines (examples of which are shown in FIGS. 5 & 6). In yet another embodiment, the illumination device 100 can be a more complex, free-form shape. Examples of more complex illumination device shapes are described in further detail below.

Figure 2:
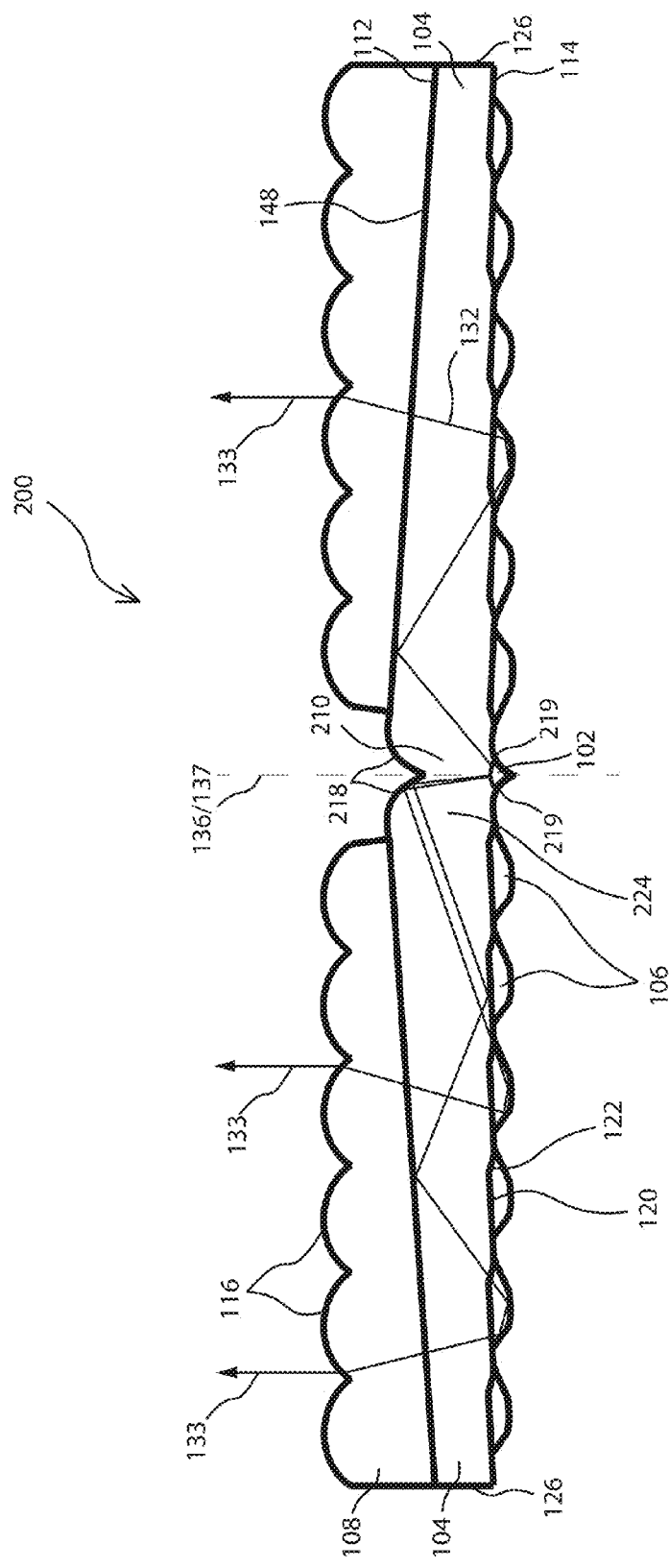
FIG. 2 is a cross-sectional view of another embodiment of an illumination device having an alternative light conditioning element.

In a similar embodiment of an illumination device 200, shown in FIG. 2, the first surface 112 of the light guide 104 can be sloped with respect to the output surface 118 such that the redirecting layer 108 is wedge-shaped in cross section and the thickness of the illumination device 200 is substantially constant. The substantially uniform thickness of the illumination device 200 facilitates alignment of the focal point of each lens 116 with the same portion of each of the corresponding reflector elements 106. A light conditioning element 210 reflects at least some of the light 130 emitted by the light source to couple that light 130 into the light guide 104 through a light coupling area 224.

In the illustrated embodiment, the light conditioning element 210 has a plurality of curved reflecting surfaces 218, 219 that reflect light 130 into the light guide 104. In other embodiments the light conditioning element 210 can have more or fewer reflecting surfaces 218, 219 and the reflecting surfaces 218, 219 can have any shape that couples light 130 from the light source into the light guide 104. As shown in FIG. 2, the light conditioning element 210 can be integrally formed (e.g., by injection molding as a single piece) with and of the same material as the light guide 104. Alternatively, the light conditioning element 210 may be formed as a separate piece.

Where the light conditioning element 210 is formed of a light transmissive material having a high index of refraction, the reflective surfaces 218, 219 can be made to reflect light 130 by TIR. Where the reflective surfaces 218, 219 are made to reflect light 130 by TIR and the light conditioning element 210 is formed as a separate piece from the light guide 104, the light conditioning element 210 is coupled to the light guide 104 by means of an optical adhesive or any other suitable bonding material or method. The optically transmissive material of which the light conditioning element 210 is made can have thermally insulating properties. An example of such a thermally insulating, optically transmissive material is glass.

Alternatively, the reflective surfaces 218, 219 can comprise mirrors. For example, a reflective coating comprising a dielectric, or metals such as aluminum or silver can be applied to reflective surfaces 218, 219 of the optically transmissive material. The light conditioning element 210 can also be made of metal or any other suitable material, attachable to the light guide 104, and may be coated with a reflective material.

Figure 3:
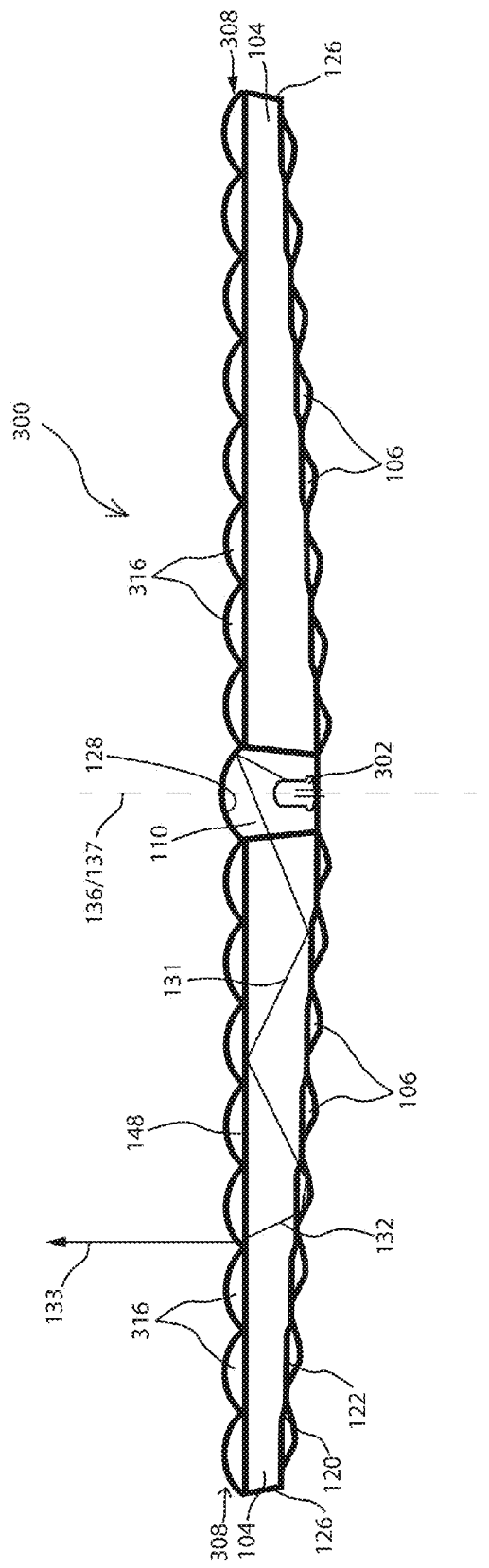
FIG. 3 is a cross-sectional view of an embodiment of an illumination device similar to that of FIG. 1, but having a different redirecting layer.

Turning to FIG. 3, there is shown a cross-section of an illumination device 300, differing from the embodiment of FIG. 1 only in that the overall thickness of the redirecting layer 308 is equal to the center thickness of the lenses and the light source 102 is an LED 302. In this embodiment the overall thickness of the illumination device 300 decreases as one moves outward from the central axis 136 or central plane 137 to the peripheral edge 126. Each of the reflector elements 106 can be the same size and shape (as shown in FIG. 3), however in an alternative embodiment, the reflector elements 106 can vary in shape moving from the central axis 136 or central plane 137 to the peripheral edge 126. The reflector elements 106 reflect the light 131 toward a corresponding lens 316. The lenses 116 condition the light for emission from the output surface 118 such that the output light 133 is collimated or otherwise directed.

Figure 4:
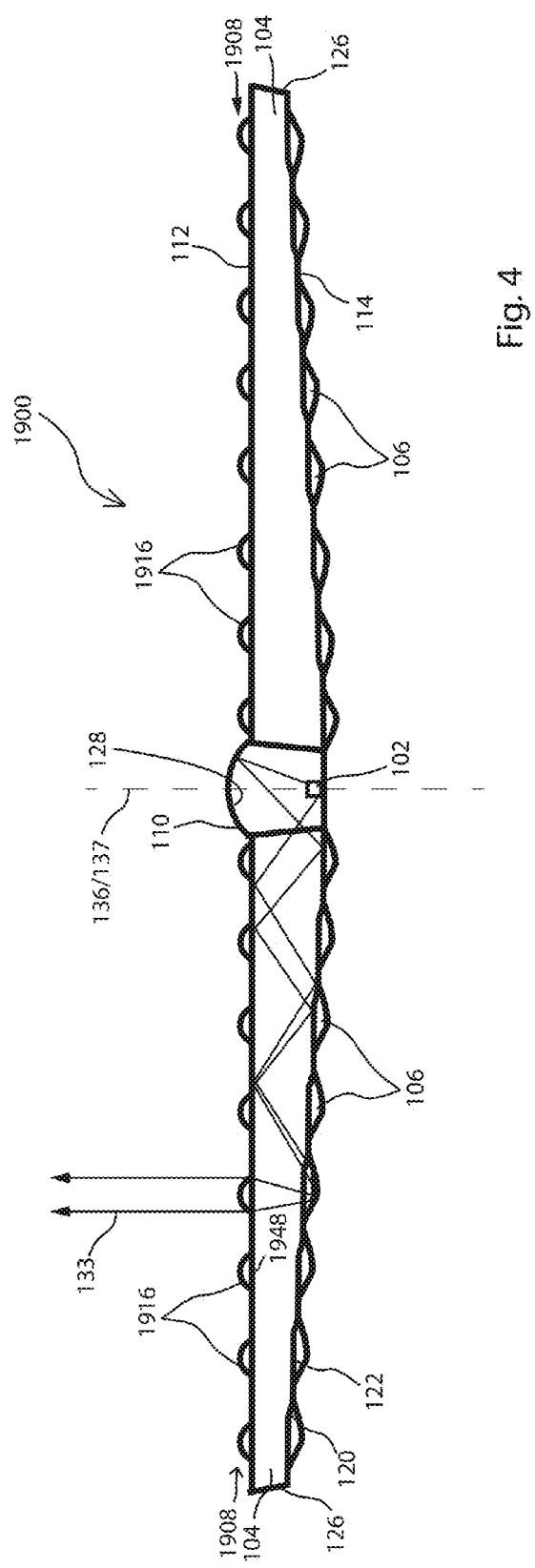
FIG. 4 is a cross-sectional view of an embodiment of an illumination device similar to that of FIG. 3 except with spaced-apart lenses.

FIG. 4 shows a cross-sectional view of an illumination device 1900 differing from the illumination device 300 illustrated in FIG. 3 only in that the lenses 1916 are spaced-apart from one another, such that the redirecting layer 1908 is discontinuous. As the lenses 1916 may be smaller in this embodiment, a conservation of materials may be realized.

As shown in FIG. 5, in some embodiments, the exposed surface of the lenses 816 may be covered by a protective coating 842. Such a protective coating 840 may be especially beneficial where the lenses are made of an elastomeric or deformable material such as a soft silicone. As an example, the protective coating 840 can be a hydrophobic coating or mica applied to the exposed surface of the lenses 816. The lenses 816 may alternatively include water/dirt-resistant nanostructures 842, such as lotus leaf nanostructures, on their exposed surfaces. These water/dirt-resistant nanostructures 842 can be molded or applied directly onto the surface of the lenses 816 during manufacturing. The surface of the lenses 816 may also have anti-reflective textures thereon, such as moth eye or cone textures. The anti-reflective textures may be applied to the surface of the lenses 816 or may be integrally formed thereon. It is also possible to affix a planar sheet of glass to the edges 826 of the illumination device 800, such that the glass sheet is suspended over the lenses 816 to protect the illumination device 800.

As shown in FIG. 6, an illumination device 900 may include an optical coupling layer 946 between the redirecting layer 908 and the light guide 904. The optical coupling layer 946 can be made of a deformable, optically transmissive material such as a silicone have a durometer less than 40 Shore A, which is deformable under an applied pressure, and can be overmolded or otherwise bonded (such as with an optically transmissive adhesive) to either the planar first surface 112 of the light guide 904 and/or to the planar surface 148 of the redirecting layer 908. The deformable, optically transmissive material may also be elastomeric. Alternatively, the optical coupling layer 946 may be made of a heat-deformable, optically transmissive material such as PMMA (e.g., Evonik™ PLEXIGLAS™ or ACRYLITE™ 8N) films having a pencil hardness in the range of 6B to 3H, hybrid PMMA-silica films having a pencil hardness in the range of 6B to 9H, or optical adhesives such as methyl methacrylate (MMA)-based optical adhesives. The optical coupling layer 946 may be formed separately from the redirecting layer 908 and the light guide 904.

The illumination device 900 may be assembled by clamping the redirecting layer 908 and the light guide 904 together with the optical coupling layer 946 disposed therebetween such that the optical coupling layer 946 is deformed by the pressure applied thereto. Alternatively, where the optical coupling layer 946 is made of a PMMA or hybrid PMMA-silica film, the illumination device 900 optic may be thermoformed or molded at high temperatures, which may cause the layers (redirecting layer 908, light coupling element 946 and light guide 904) to become fused together to create a monolithic optic. An optical bond between the redirecting layer 908, the optical coupling layer 946 and the light guide 908 can thus be created to facilitate the transmission of light 132 from the light guide 904 through the optical coupling layer 946 and into the redirecting layer 908.

In this embodiment, the light guide 904, the redirecting layer 908 and the reflector elements 106 can be made of the same or different light transmissive materials, such as glass or an injection molded polymer. The light coupling element 946 may be made of a deformable, low refractive index material such as a silicone sandwiched between a light guide 904 made of a high refractive index material such as glass or an injection molded polymer and a redirecting layer 908 made of a high refractive index material such as glass or an injection molded polymer to form the optic of the illumination device 900.

Figure 7:
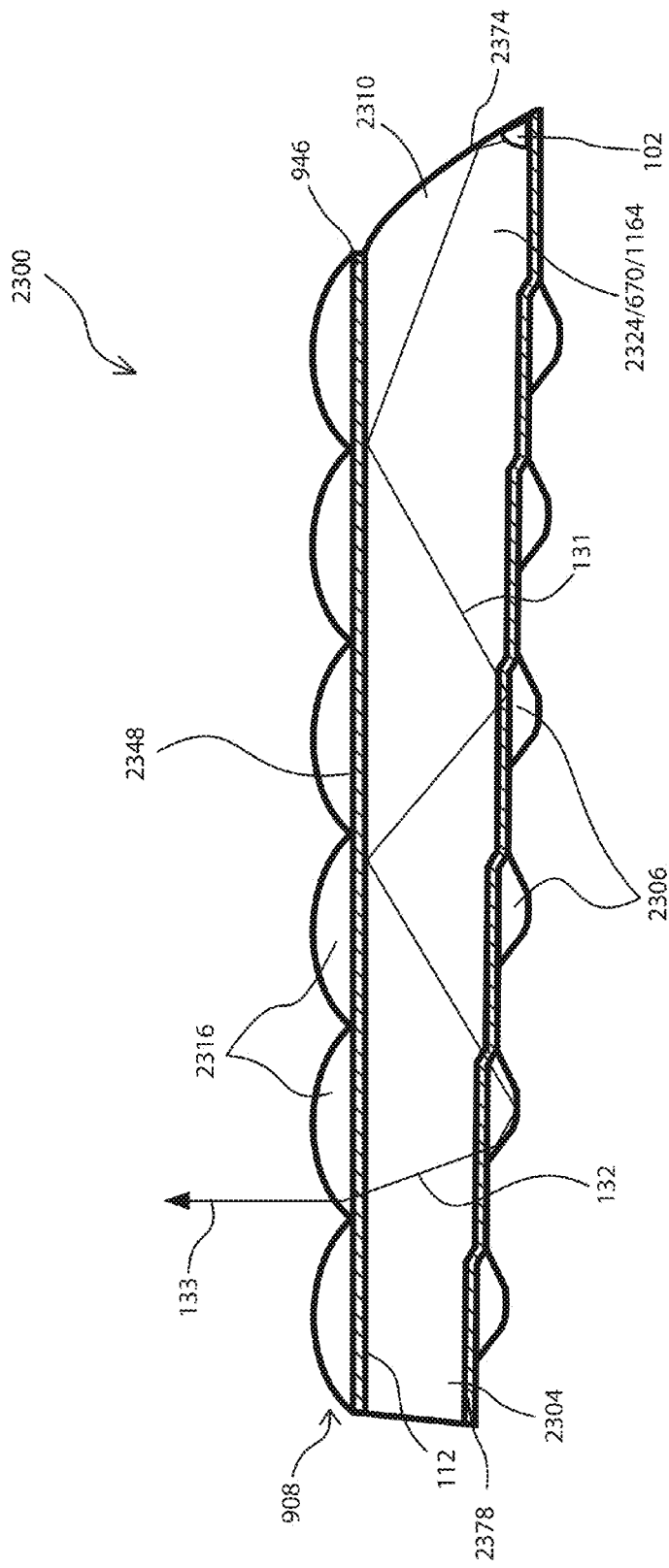
FIG. 7 is a cross-sectional view of an embodiment of an illumination device having optical coupling layers between the light guide and the redirecting layer, and the light guide and the reflector elements.

As shown in FIG. 7, the illumination device 2300 may additionally or alternatively include an optical coupling layer 2378 between the light guide 2304 and the reflector elements 2306. The optical coupling layer 2378 can be made of the same materials as optical coupling layer 946 and can similarly be overmolded or otherwise bonded to the light guide 2304 and/or the reflector elements 2306.

Figure 8:
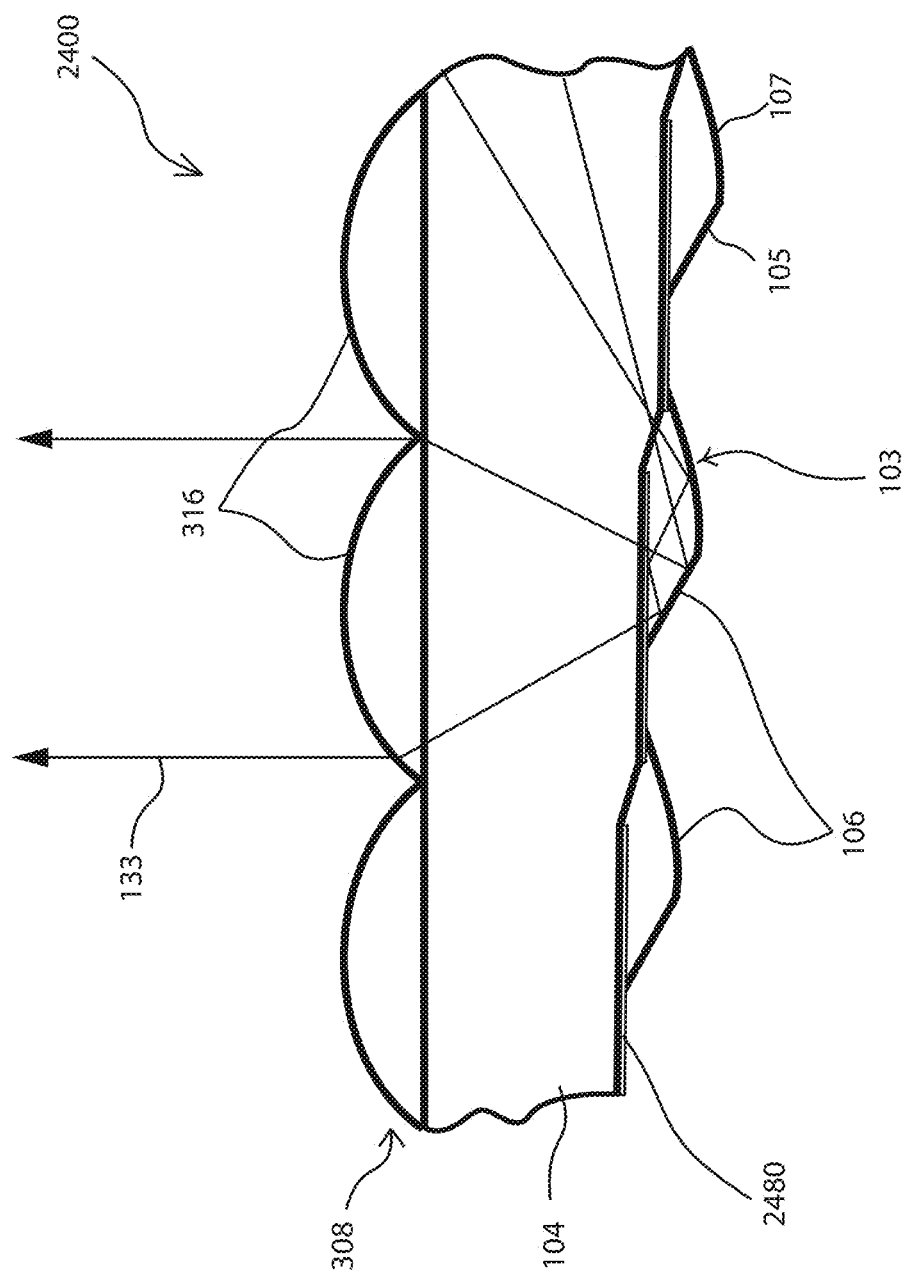
FIG. 8 is a partial cross-sectional view of an embodiment of an illumination device having a low refractive index film on step portions of the second surface of the light guide.

As shown in FIG. 8 the illumination device 2400 may include a low refractive index film 2480 between each reflector element 106 and the light guide 104 to facilitate TIR at the interface between the low refractive index film 2480 and the reflector element 106. Light 131 entering the reflective element 106 via the corresponding inter-step portion 122 and reflected by a second portion 107 of the reflective surface 103 of the reflector element 106 can therefore undergo TIR at the interface between the low refractive index film 2480 and the reflector element 106 and does not escape from the reflector element 106 until it is reflected by the first portion 105 of the reflective surface 103. The second portion 7 may, for example, be a flat surface angled such that light is redirected to impinge upon the low refractive index film 2480 at an angle of incidence that is less than the critical angle such that the light passes through to the low refractive index film 2480 and the light guide 104 to the corresponding lens 116.

Figure 9:
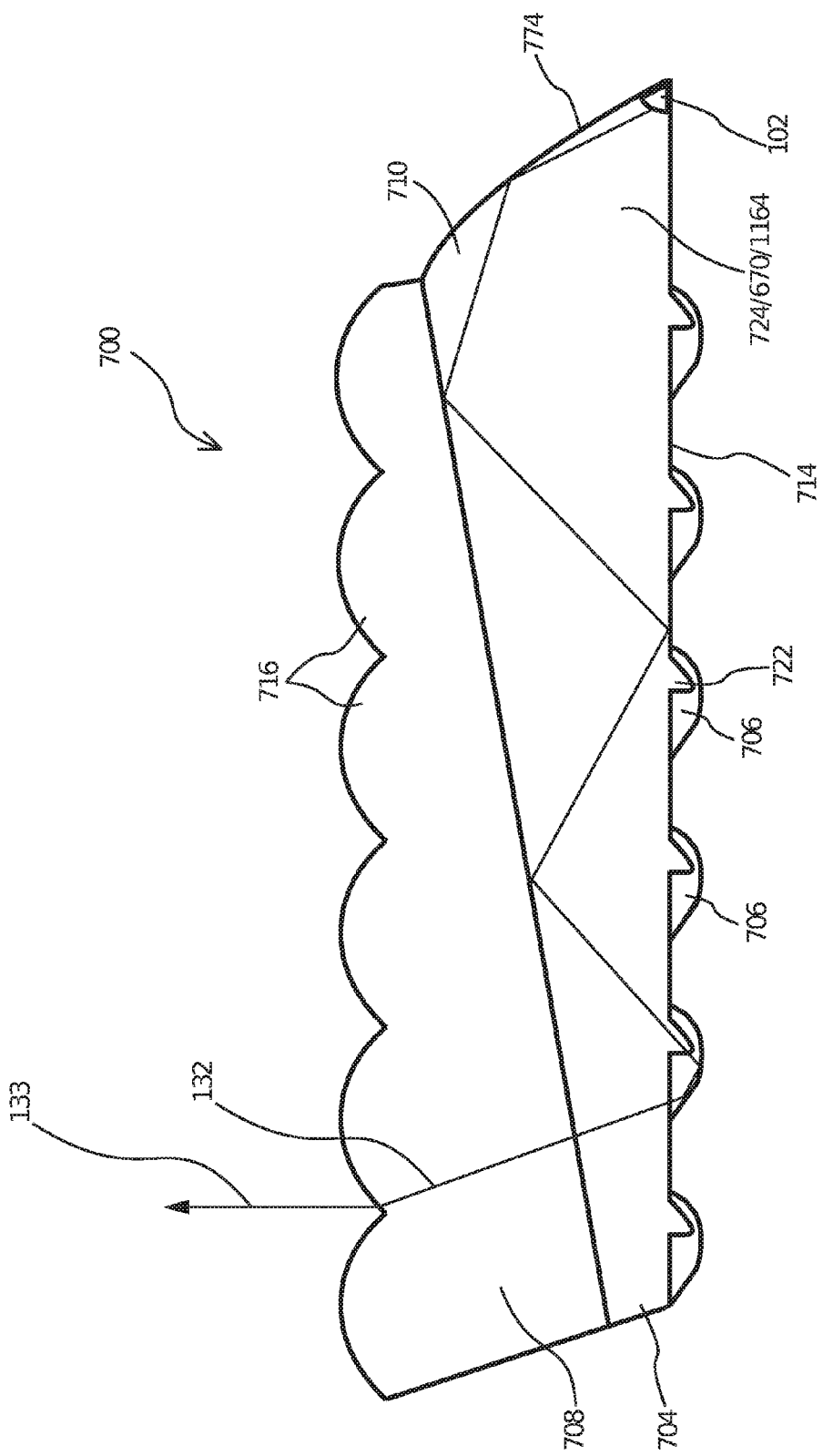
FIG. 9 is a cross-sectional view of an embodiment of an illumination device having protrusions extending from the second surface of the light guide into the reflector elements.

FIG. 9 shows a cross-section of an illumination device 700 that differs from the half cross-section of the illumination device 200 of FIG. 2 only in that the second surface 714 is not stepped, but rather is substantially flat with protrusions 722 extending therefrom, and the light conditioning element 710 is positioned along a light input edge 670 or a light input corner 1164 (described in further detail below). The light conditioning element 710 has a light conditioning surface 774 that reflects light for insertion into the light guide 704. An optical aperture through which light escapes from the light guide 704 is formed between each of the protrusions 722 and its corresponding reflector element 706 (similar to that formed between the inter-step portions 122 and the reflector elements 106). Each protrusion 722 is encapsulated (as shown in FIG. 9) by or otherwise optically coupled to a reflector element 706.

Figure 10:
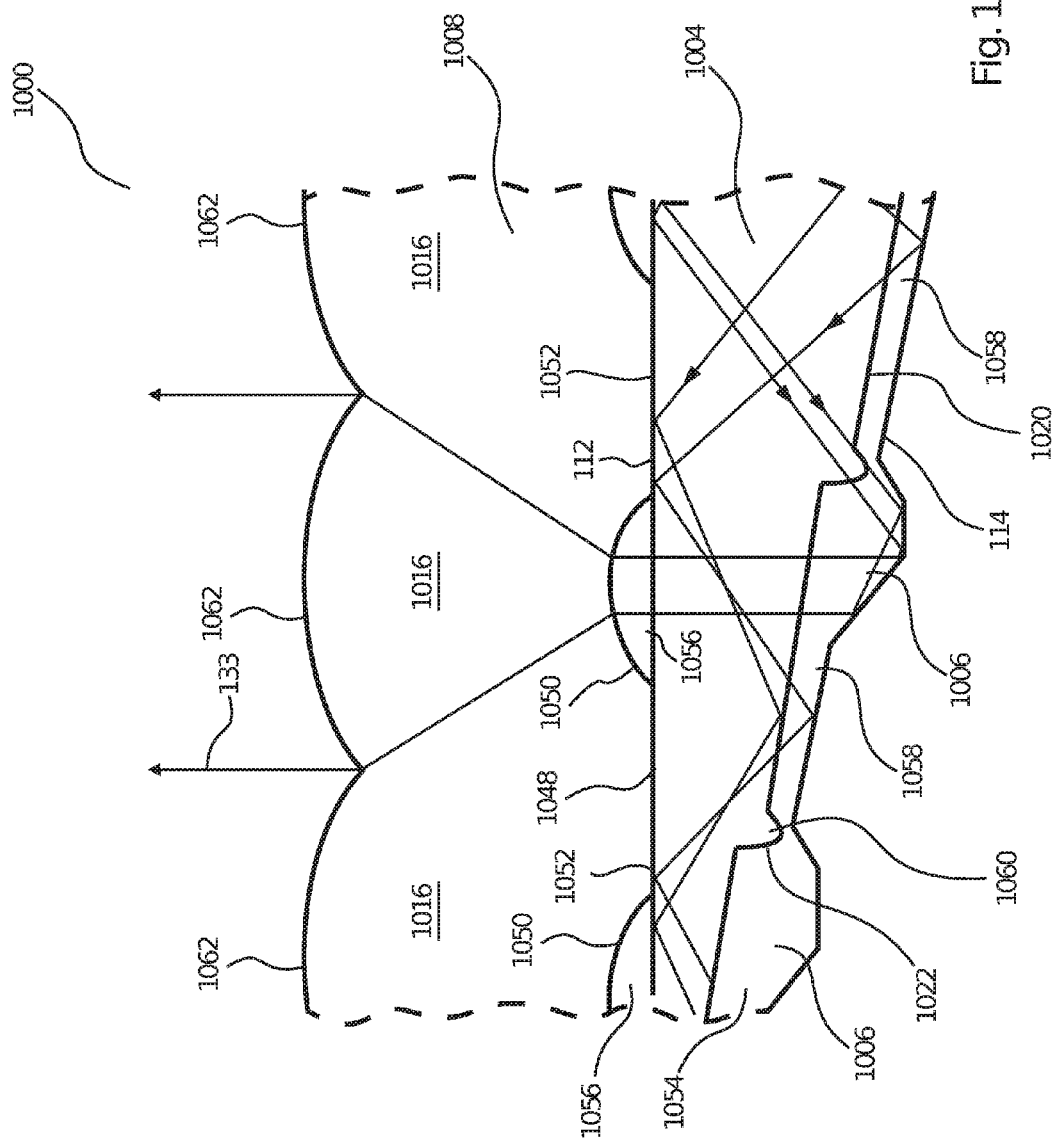
FIG. 10 is a partial cross-sectional view of another embodiment of an illumination device having protrusions extending from the second surface of the light guide into the reflector elements.

FIG. 10 shows a partial cross-section of an illumination device 1000 that includes a redirecting layer 1008 that has a plurality of concavo-convex lenses 1016, a stepped light guide 1004, and a reflector layer 1054 that has a plurality of reflector elements 1006. The planar surface 1048 of the redirecting layer 1008 has a plurality of concavities 1050 being the concave portions of each concavo-convex lens 1016. Separating the concavities 1050 of the redirecting layer 1008, may be a plurality of planar segments 1052. The redirecting layer 1008 can be overmolded onto the first surface 112 of the light guide 1004 or alternatively bonded thereto with an adhesive or by laser welding, such that the planar segments 1052 are bonded to the planar first surface 112 of the light guide 1004. The gaps 1056 remaining between the first surface 112 of the light guide 1004 and the concavities 1050 of the redirecting layer 1008 can be filled with air or any suitable light transmissive material that has a lower refractive index than the redirecting layer 1008.

The step portions 1020 of the second surface 114 of the light guide 1004 need not be parallel to the first surface 112 of the light guide 1004 as shown in the figures described above, but rather can be sloped as shown in FIG. 10. The light guide 1004 can also have protrusions 1060 similar to those of FIG. 9 extending from the second surface 114.

In this embodiment, the plurality of reflector elements 1006 are provided in a reflector layer 1054 which may be overmolded onto the second surface 114 of the light guide 1004 or alternatively bonded thereto with an optical adhesive or by laser welding. The reflector layer 1054 thereby includes a plurality of reflector elements 1006 and a plurality of secondary reflector sections 1058 joining the reflector elements 1006. The redirecting layer 1008 and the reflector layer 1054 can be made of a silicone of lower refractive index than the material of the light guide 1004. As with other similar embodiments, the illumination device 1000 can be flexible where flexible materials are used, e.g., a high refractive index silicone is used for the light guide 1004.

In this embodiment, light emitted by a light source is coupled into the light guide 1004 where it is totally internally reflected towards a peripheral edge by the first surface 112 of the light guide 1004, by the step portions 1020 of the light guide 1004, and/or by the secondary reflector sections 1058 of the reflector layer 1054. Total internal reflection can occur on the first surface 112 of the light guide 1004 both where it interfaces with a gap 1056, and where it interfaces with a planar segment 1052 of the redirecting layer 1008. Each inter-step portion 1022, formed at least in part on a surface of a protrusion 1060, allow a wider range of angles of light to enter through the aperture that is formed between the inter-step portions 1022 and the reflector elements 1006 than would be possible without the protrusion 1060. Light entering the reflector element 1006 is then reflected by the surfaces of the reflector elements 1006 such that beams of substantially collimated light are transmitted to the concave portions (cavities) 1050 of the redirecting layer 1008. Light diverges away from the cavities 1050, and can be recollimated by the convex portion 1062 of the lenses 1016, such that output light 133 is collimated and evenly distributed across the surface of the illumination device 1000. In embodiments of the illumination device where there is no redirecting layer 1008, the illumination device would emit parallel beams of collimated light.

Figure 11:
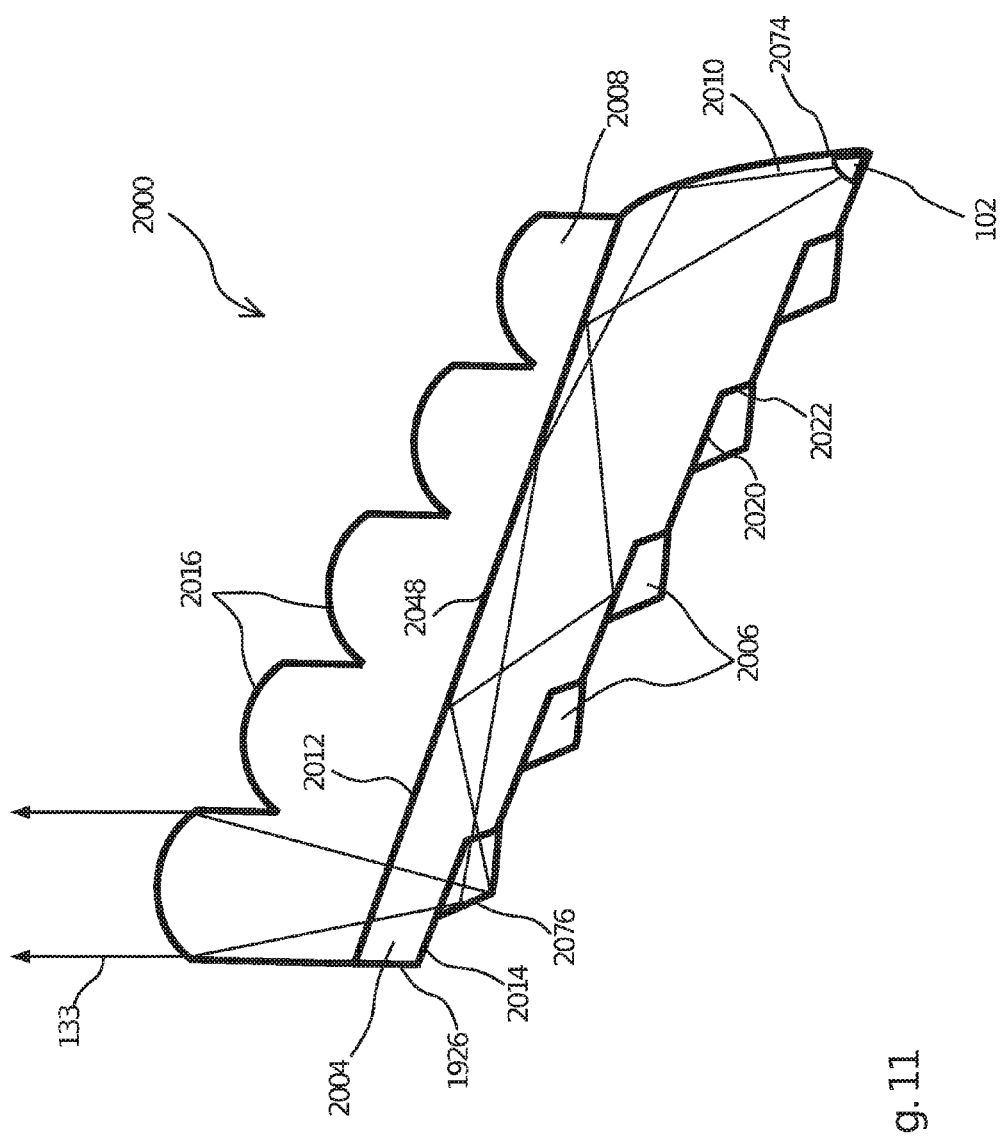
FIG. 11 is a cross-sectional view of an embodiment of an illumination device that is sloped.

FIG. 11 shows a cross-section of an illumination device 2000 that has a sloped orientation with respect to the direction of the output light 133. If the illumination device 2000 is oriented to emit output light 133 in an upward direction as shown in FIG. 11, then the illumination device 2000 can be said to have an upward slope from the light source 102 toward the peripheral edge 2026.

The redirecting layer 2008 generally increases in thickness from the edge closest to the light source 102 to the peripheral edge 2026 and can have a sloped planar surface 2048. In order to maintain the orientation of the lenses 2016, the lenses 2016 can be stepped as shown in FIG. 11.

The first surface 2012 of the light guide 2004 may also be sloped to complement the planar surface 2048 of the redirecting layer 2008. The step portions 2020 of the second surface 2014 of the light guide 2004 may be parallel to the planar surface 2048 and may therefore also be sloped.

In some embodiments, due to the sloped configuration of the illumination device 2000, light received by the reflector elements 2006 via the inter-step portions 2022 may only impinge upon the first portion 2005 of the reflective surface 2003, in which case only the first portion 2005 needs to be reflective. The sloped configuration of the illumination device 2000 may also facilitate the optimization of the design of the light conditioning element 2010 for efficient transmission of light from the light source 2002 into the light guide 2004.

Figure 12:
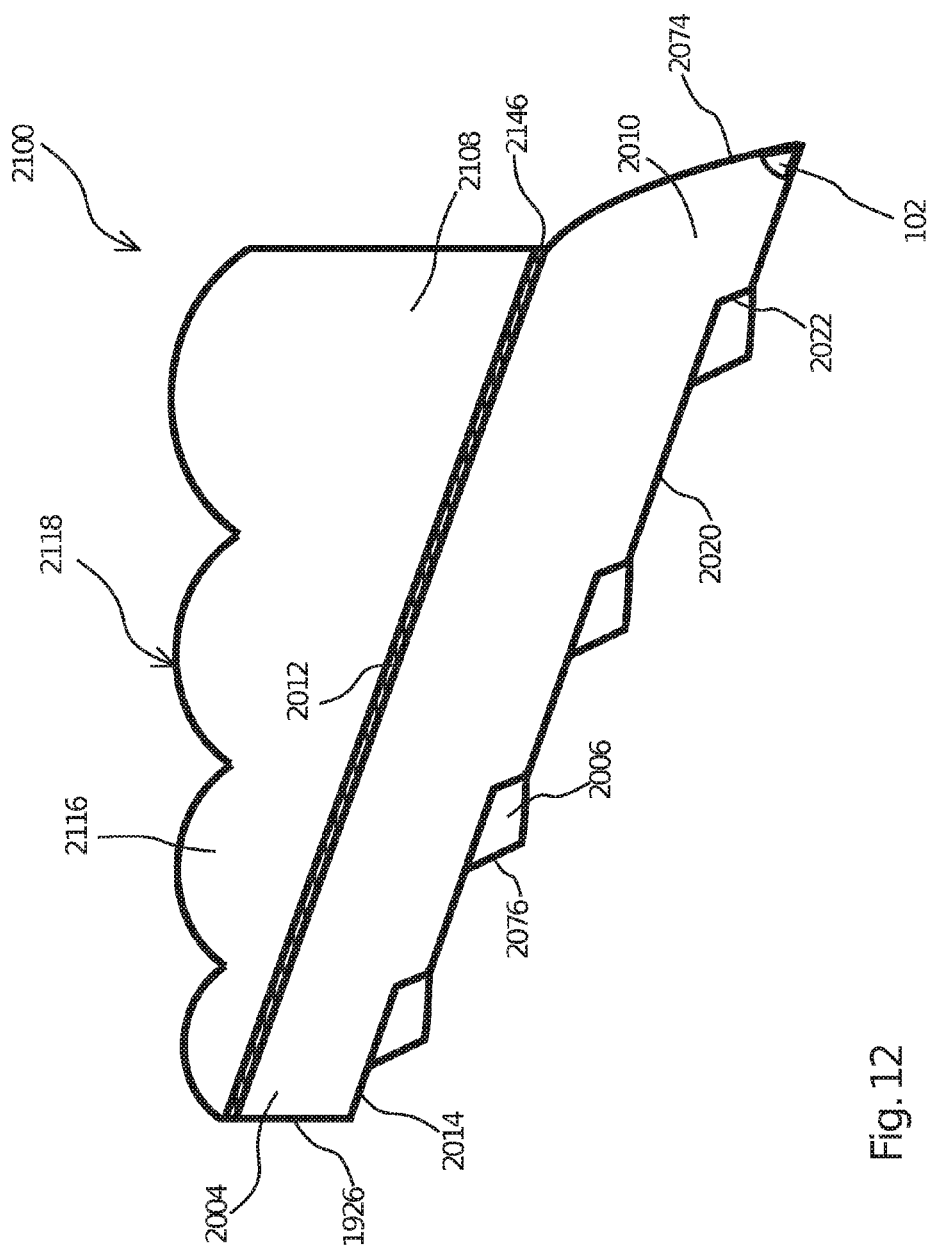
FIG. 12 is a cross-sectional view of another embodiment of an illumination device that is sloped.

FIG. 12 shows a cross-section of an illumination device 2100 that differs from the illumination device 2000 of FIG. 11 only in that the lenses 2116, their corresponding reflector elements 2106 and the distance between a lens 2116 and its corresponding reflector element 2106 are scaled in inverse proportion with their distance from the light source 102 and has an optical coupling layer 2146 similar to that of the illumination device 900 of FIG. 6. The plane of the output surface 2118 can therefore be made perpendicular to the direction of the output light 133. Such scaling of the optical elements may help to make the output light 133 more uniform in intensity and collimation across the output surface 2118.

Figure 13:
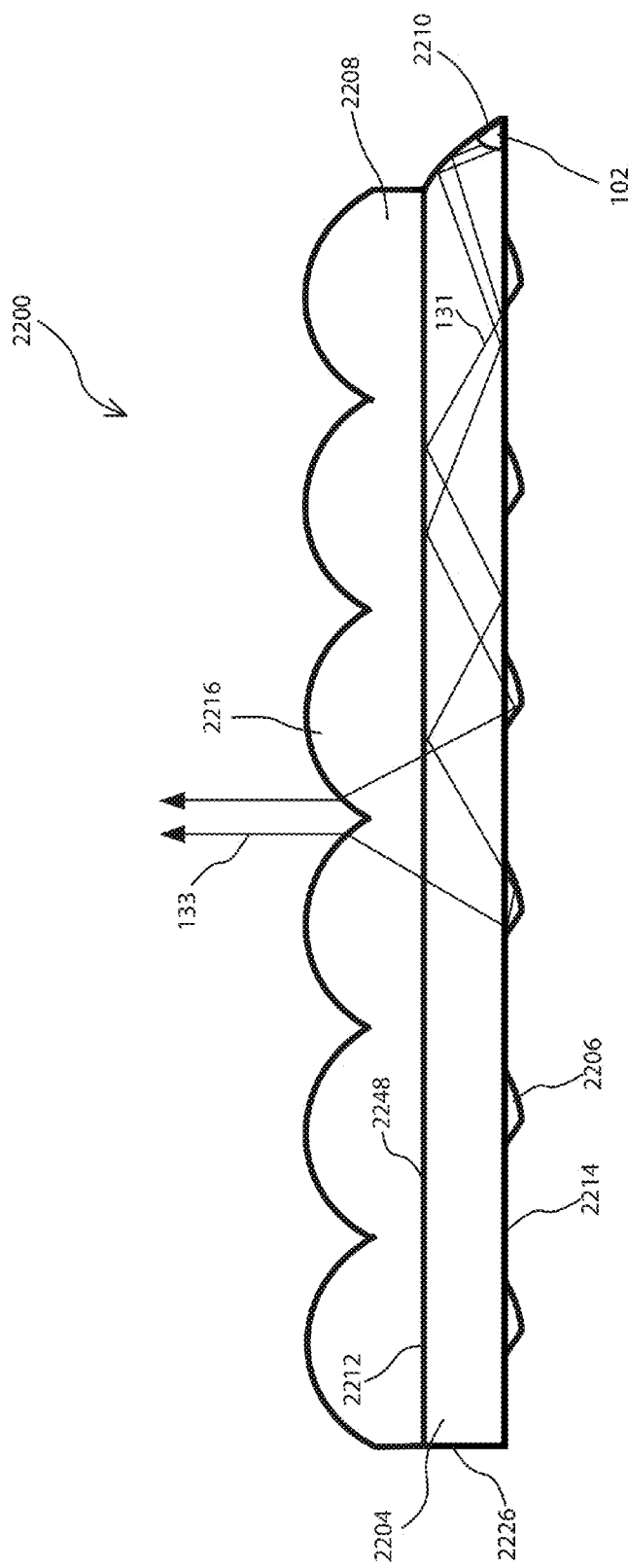
FIG. 13 is a cross-sectional view of an embodiment of an illumination device that has a substantially flat light guide.

FIG. 13 is a cross-section of an illumination device 2200 that is similar to the illumination device 100 of FIG. 1, except that the light guide 2204 of the illumination device 2200 comprises a substantially flat sheet of light transmissive material. The light transmissive material of the redirecting layer 2208 can have an index of refraction that is higher than the surrounding environment of the illumination device 2200 (typically a gas such as air) but lower than the light transmissive material of the reflector elements 2206 and the light guide 2204. Light 131 can therefore be guided within the light guide 2204 by total internal reflections on the first surface 2212 of the light guide 2204 and portions of the second surface 2214 exposed to the surrounding environment. However, light 131 travelling within the light guide 2204 that encounters a portion of the second surface 2214 to which an reflector element 2206 is optically bonded can be transmitted into the reflector element 2206 and reflected by the reflecting surface 2207 toward the corresponding lens 2216 (without undergoing TIR at the interface between the planar surface 2248 of the redirecting layer 2208 and the first surface 2212 of the light guide 2204), which may collimate the light.

Figure 14:
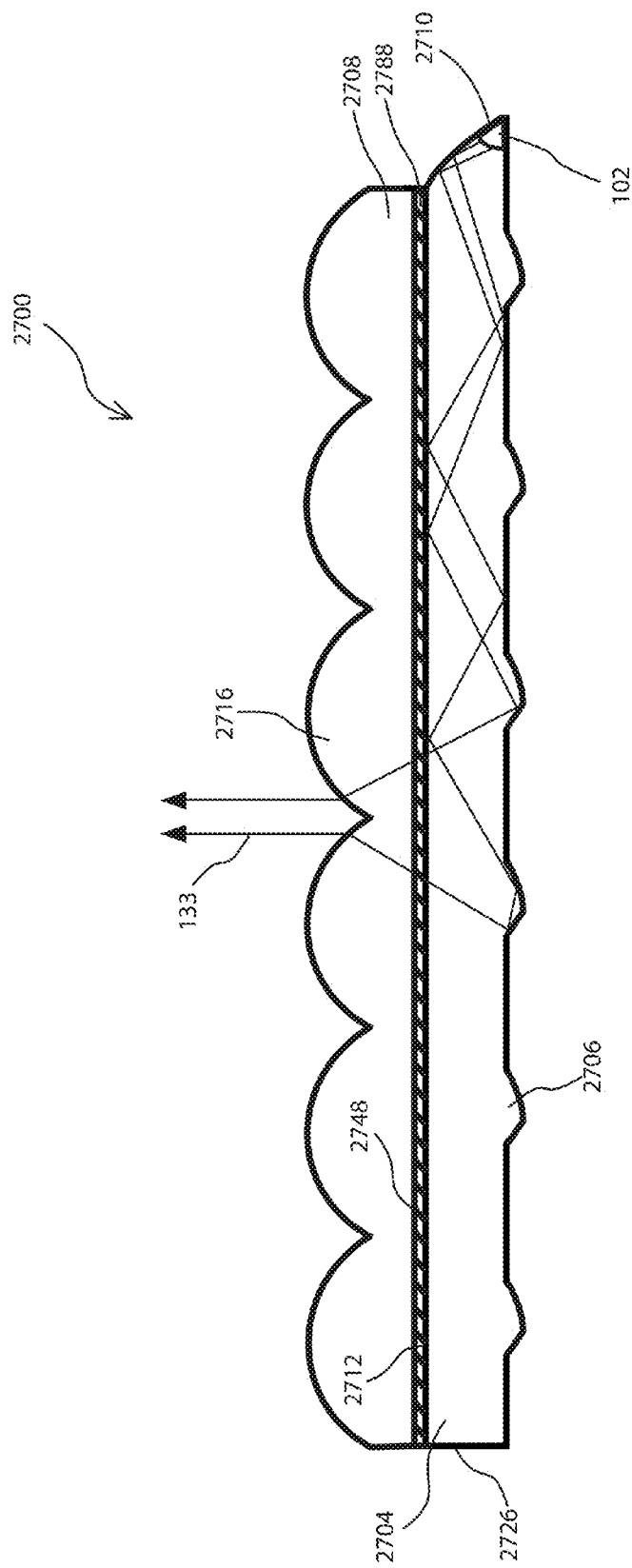
FIG. 14 is a cross-sectional view of an embodiment of an illumination device that has reflector elements integrally formed with the light guide.

FIG. 14 shows a cross-section of an illumination device 2700 that differs from the illumination device 2200 of FIG. 13 only in that the reflector elements 2706 are integrally formed with the light guide 2704 and there is an optical coupling layer 2788 similar to the optical coupling layer 946 of FIG. 6. The optical coupling layer 2788 is made of a light transmissive material that has an index of refraction that is lower than the index of refraction of the light guide 2704 such that light 131 can be guided within the light guide 2704 by total internal reflection even if the index of refraction of the redirecting layer 2708 is not lower than that of the light guide 2704. Manufacture of this illumination device 2700 may be simpler than other illumination devices because it comprises only two separate parts—the redirecting layer 2708 and the light guide 2704 with integrally formed reflector elements 2706. The two parts can be assembled into an illumination device 2700 using an optical adhesive as the optical coupling layer 2788.

While a full cross-sections of illumination devices having symmetry about a central axis 136 or plane 137 are not shown for all embodiments of the illumination devices 800, 900, 2300, 700, 2000, 2100, 2200, 2700 described above, a person skilled in the art will appreciate that the cross-sections shown can be reflected through a central axis 136 or plane 137 and a suitable light conditioning element 110, 210 employed to produce symmetric illumination devices.

As described above, FIG. 15 is a perspective view of an illumination device 400 having the general shape of a circular disk and having circular symmetry about a central axis 136. This embodiment can have a cross-sectional profile similar to any of the embodiments described above. In this embodiment, the redirecting layer 408 is discoid and comprises a plurality of lenses 416 concentrically disposed. The lenses 416 may be cylindrical lenses forming concentric rings about the central axis 136 of the illumination device 400. The light guide 404 is also disk-shaped and has substantially the same diameter as the redirecting layer 408. The light guide 404 has a centrally located light coupling surface 424, which may, for example, have the shape of a truncated cone, or a cylinder. The plurality of reflector elements (not shown) is concentrically disposed. The disk-shaped illumination device 400 can be cropped to make the illumination device 400 a tileable shape, such as square or hexagonal, while conserving its revolved geometry. Where the illumination device 400 has a revolved geometry, the light conditioning element 410 also has a revolved geometry, whether it is a light conditioning element that guides light by TIR or specular reflections.

The light source 102 is a point source. As shown in FIG. 15, the light source 102 can be the terminus of an optical fibre 402 which transmits light from a remote, originating light source.

In an alternate embodiment shown in FIG. 16, the illumination device 400 may be cropped to make an illumination device 1100 rectangular in shape with the axis of rotational symmetry 1162 at one corner 1164 of the illumination device 1100, as shown in FIG. 16. The redirecting layer 1108 is generally in the shape of a planar cuboid and comprises a plurality of lenses 1116 coaxially disposed. The lenses 1116 can be cylindrical lenses forming concentric circular arcs centred on the axis of symmetry 1162. The light guide 1104 also has the shape of a planar cuboid and has substantially the same width and length as the redirecting layer 1108. The light guide 1104 has a light coupling surface 1124 located in the vicinity of the axis of symmetry 1162. The light coupling surface 1124 can have the shape of a truncated cone, or a cylinder. The light source 1102 is disposed along the central axis 1162, and is optically and mechanically bonded to the light coupling surface 1124, for example by means of an optical adhesive. The plurality of reflector elements 1106 is likewise coaxially disposed. In this embodiment, light propagates in the light guide towards the outer edges 1166.

With reference to FIG. 17, there is shown a perspective view of an illumination device 500 having the general shape of a planar cuboid with height Z, relatively small as compared to its width X and length Y. In this embodiment, the optically active elements (reflector elements 506, step portions 520, inter-step portions 522, and lenses 516) lie along straight and parallel lines, parallel to the central plane 137. The illumination device 500 can have a longitudinal section along width X similar to any of the figures described above showing cross-sections of illumination devices. The illumination device 500 has two redirecting layers 508, and two light guides 504, each disposed on either side of the central plane 137. The illumination device 500 can be symmetric about the central plane 137 as shown in FIG. 17, but need not be symmetric. Each light guide 504 has a light coupling surface 524 in the vicinity of the central plane 137 to receive light from the light source 502. In the illustrated embodiment, the light coupling surfaces 524 complement the shape of the profile of the light source 502, such that the light source 502 can be held in place by the light coupling surfaces 524. The light source 502, which can be a fluorescent tube, an LED tube, a longitudinal light conditioning element optically coupled to a point source such as the terminus of an optical fibre, or any other type of longitudinal light source, is disposed lengthwise along the central plane 137. In one embodiment, the illumination device 500 can be manufactured as a single piece with a cavity located longitudinally along the central plane 137 for insertion of the light source 502. In another embodiment, each side of the illumination device 500 (comprising a redirecting layer 508, a light guide 504 and a plurality of redirecting elements 506) can be manufactured separately and then bonded together by means of an optical adhesive or any other suitable material or method, including clamping.

Cuboid shaped illumination devices 500 may be cropped to make the illumination device any desirable overall shape, such as hexagonal or circular discs, keeping the optically active elements straight and parallel. In some embodiments, the illumination device 500 may include a secondary optical element to aid in coupling light from the light source 502 to the light guides 504.

With reference to FIG. 18, an illumination device 600 may include one redirecting layer 508, one light guide 504, and one set of reflector elements 506, such that the light source 602, runs along light coupling surface 624 of the illumination device 600, as shown in FIG. 18. In this embodiment the exposed surface of the light source 602 can be coated with a reflective material 672 such that some, preferably most or most preferably, all, light is reflected towards the light guide 504. Alternatively, a tubular cavity or other means for retaining the light source 602 along the light coupling surface 624 can be provided with a reflective peripheral surface for reflecting light towards the light guide 504. In another embodiment, a light conditioning element optically coupled to a point source may extend longitudinally across the light input edge 670 such that the light from the light source is coupled into the light guide 504 through the light coupling surface 624. In some embodiments, such as that shown in FIG. 18, the light source 602 can cover the entire light coupling surface 724.

The illumination device 2500 shown in FIG. 19A has an array of lens-reflector element pairs. In this embodiment, the redirecting layer 2508 includes a substrate sheet 2586 made of light transmissive material and the array of lenses 2516 extending from the first surface 2587 of the substrate sheet 2586. The lenses 2516 may be integrally formed with the substrate sheet 2586, may be 3D printed or overmolded onto the substrate sheet 2586, or may be otherwise optically bonded to the first surface 2587 (e.g., using an optical adhesive, by laser welding or any other means known in the art). The lenses may, for example, be spherical caps or quarter-spherical caps (not shown).

Similar to the light guide 2204 of FIG. 13, the light guide 2504 can comprise a substantially flat sheet of light transmissive material. A light conditioning element 2510 may also be provided to evenly distribute light in all directions within the light guide 2504 and thereby even out the intensity of light impinging upon the reflector elements 2506 at any given distance from the light source 102. In the illustrated embodiment, the light source 102 is the terminus of an optical fibre. The light conditioning element 2510 may be integrally formed with the light guide 2504, may be 3D printed or overmolded onto the light guide 2504, or may be otherwise optically bonded to the second surface 2514 of the light guide 2504 (e.g., using an optical adhesive, by laser welding or any other means known in the art). Alternatively, a cavity may be provided in the light guide 2504 and the light conditioning element 2510 may be inserted into the cavity. As the light source is effectively extended into the light guide 2504 in the latter embodiment, it may be easier to direct light toward the nearest corners of the illumination device 2500 where the light source is located toward the centre of one side of the illumination device 2500 as shown in FIG. 19A. Producing a more uniform distribution of light may be facilitated by placing the light source 102 and the light conditioning element 2510 at a corner of the illumination device 2500 or toward the centre of the illumination device 2500.

Figure 19C:
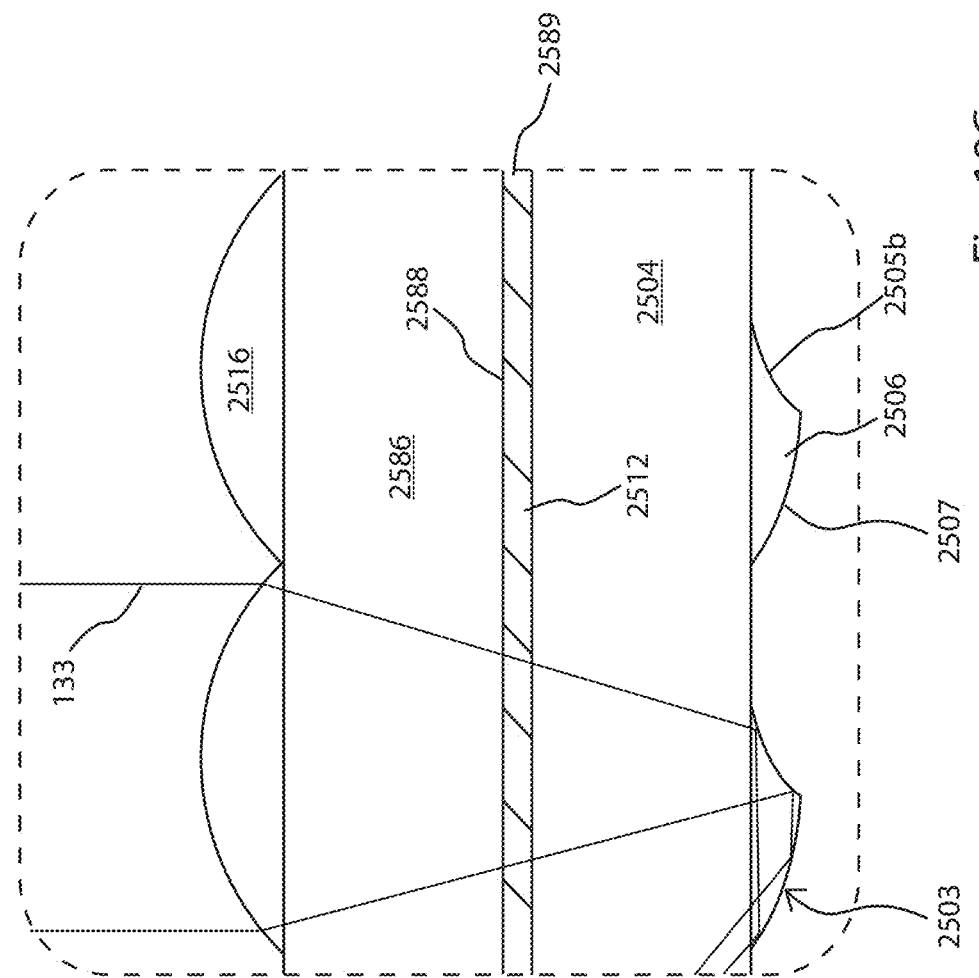
FIG. 19C is a partial cross-sectional view of an illumination device having reflector elements that have reflective surface with a convex portion.

The array of reflector elements 2506 may be integrally formed with the light guide 2504, may be 3D printed or overmolded onto the light guide 2504, or may be otherwise optically bonded to the second surface 2514 of the light guide 2504 (e.g., using an optical adhesive, by laser welding or any other means known in the art). The reflector elements 2506 can be nubs and can each have a reflective surface 2503 having a first portion 2505 that is, for example, a concave reflector 2505a (as shown in FIG. 19B) or convex reflector (as shown in FIG. 19C). The reflector elements 2506 may be non-uniform in shape, size and/or orientation so that each reflector element 2506 reflects approximately the same amount of light toward its corresponding lens 2516 such that the output light 133 and output from each lens 2516 is substantially uniform in intensity across the output surface 2518.

The illumination device 2500 may include an optical coupling layer 2589 between the second surface 2588 of the substrate sheet 2586 and the first surface 2512 of the light guide 2504 similar to the optical coupling layer 946 of the illumination device 900 of FIG. 6. The optical coupling layer 2589 has an index of refraction that is lower than that of the light guide 2504 such that light 131 is reflected at the first surface 2512 of the light guide 2504 by TIR.

While the illumination devices described above were shown to be substantially planar, they need not be so. For example, the illuminations devices 1200, 1300, 1400 can be curved as shown in FIGS. 20-22.

Figure 21:
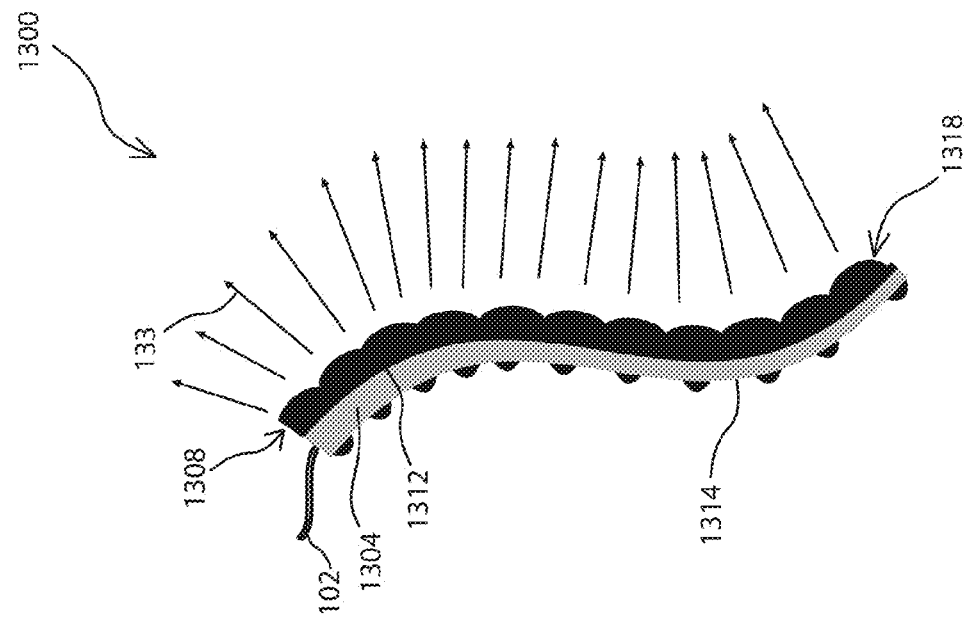
FIGS. 20, 21 and 22 are cross-sectional views of curved embodiments of illumination devices.
Figure 20:
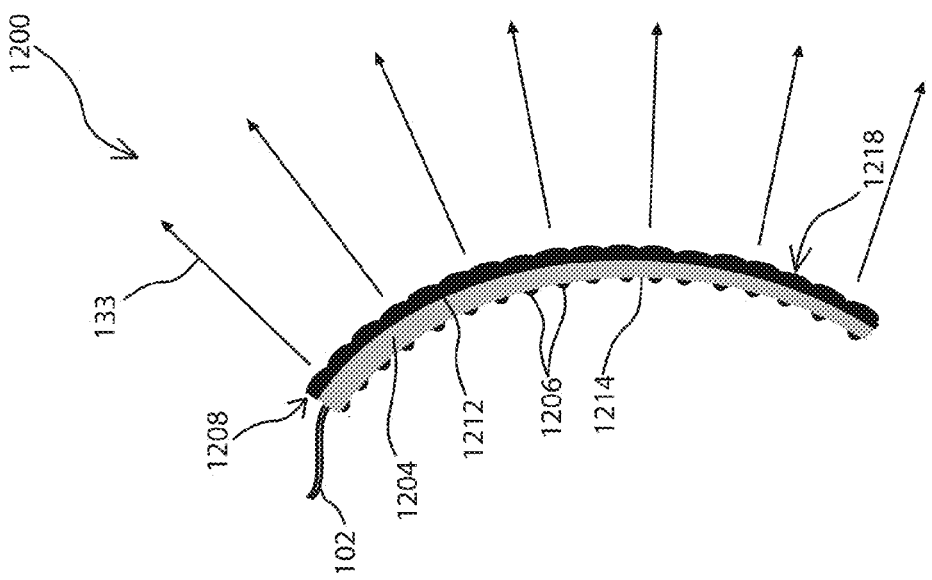

Depending on the orientation of the optically active elements, the light emitted from the illumination device 1200, 1300 may be perpendicular to the output surface 1218, 1318 such that the output light 133 diverges where the illumination device 1200, 1300 has a convex curve (as shown in FIG. 20 and the portion of the illumination device 1300 closest to the light source 102 of FIG. 21) and converges where the illumination device 1300 has a concave curve (as in the portion of the illumination device 1300 furthest away from the light source 102 of FIG. 21).

Figure 22:
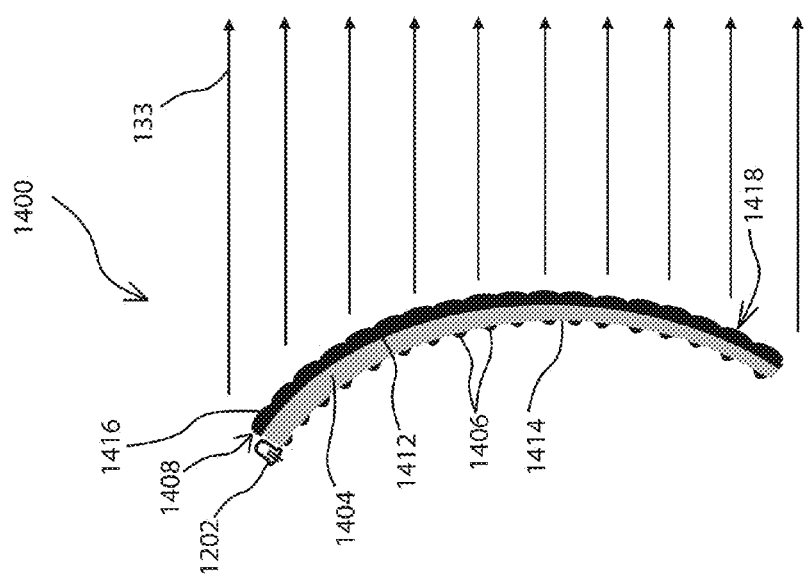

Alternatively, the light 133 emitted from the illumination device 1400 may be collimated to form a beam (as shown in FIG. 22) even though of the illumination device 1400 is curved. Collimation may be achieved by orienting the active optical elements of the illumination device 1400 such that the light emitted from each lens 1416 is parallel and not necessarily normal to the output surface 1418.

Where the light guide 1204, 1304, 1404 is made of a rigid material such as glass or PMMA, the illumination device 1200, 1300, 1400 will retain its shape. The cross-section of the illumination device may therefore have the shape of an arc of fixed radius as shown in FIGS. 20 and 22, or may have the shape of a combination of one or more curves as shown in FIG. 21. However, where the light guide 1204, 1304 and redirecting layer 1208, 1308, are made of flexible materials such as silicone, the optic of the illumination device 1200, 1300 can be flexible. In some embodiments, the illumination device 1200, 1300 can be made entirely of flexible materials in which case the whole of the illumination device 1200, 1300 is flexible.

The embodiments shown in FIGS. 20, 21, 22 include a light source 102 at one end of the illumination device 1200, 1300, 1400 but the light source 102 could be disposed toward the centre of the illumination device such as shown in FIGS. 1-4, 15 and 17.

Figure 23:
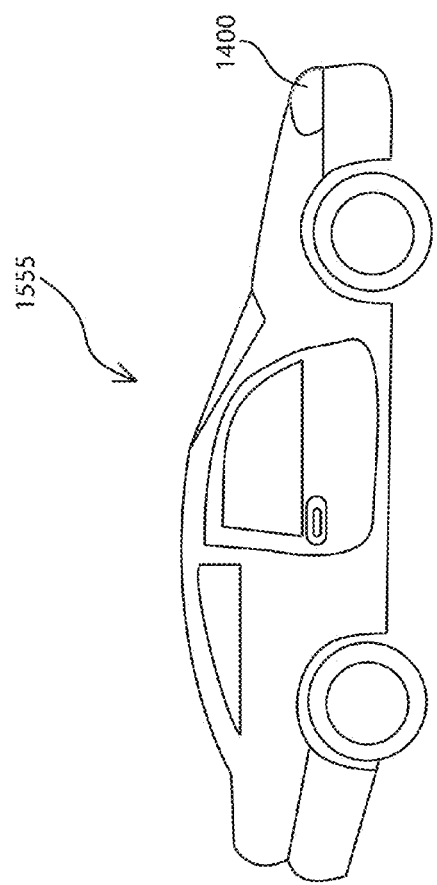
FIG. 23 is an illustration of an embodiment of an illumination device on a vehicle.

With reference to FIG. 23, a vehicle 1555 may include an illumination device 1400 as part of its headlight assembly. When illuminated, the illumination device 1400 directs light forwardly from the vehicle. The light from the illumination device 1400 may be completely or partially collimated to provide a beam of light or focused to provide a broader or narrower beam of light.

Figure 24:
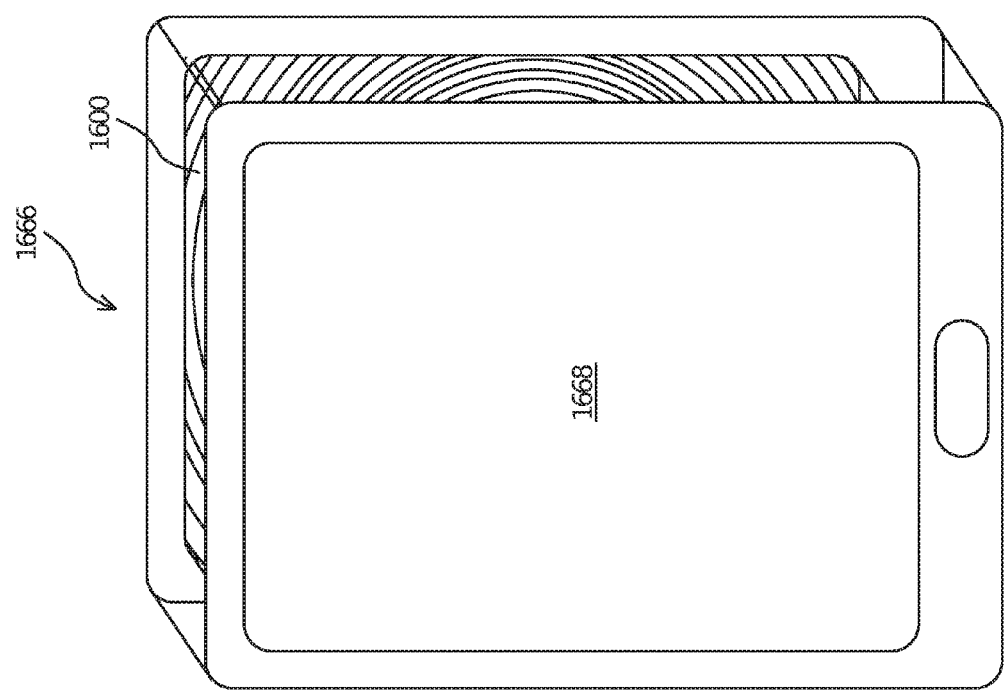
FIG. 24 is an illustration of an electronic device employing an illumination device.

With reference to FIG. 24, an electronic device 1666, such as a mobile communication device, tablet or laptop computer, monitor or sign, may include an illumination device 1600 to backlight a display 1668. The illumination device 1600 may be planar cuboid with cropped circular lenses similar to that shown in FIG. 15. Alternatively, the illumination device 1600 may have linear lenses (not shown) similar to that shown in FIG. 17. In this way, a single light source 102 may serve to illuminate the display. The depth in the electronic device 1666 required to accommodate the illumination device 1600 may only be a depth of Z as indicated in FIG. 17 and as such allow the design of an electronic device 1666 with a slim profile.

Figure 25:
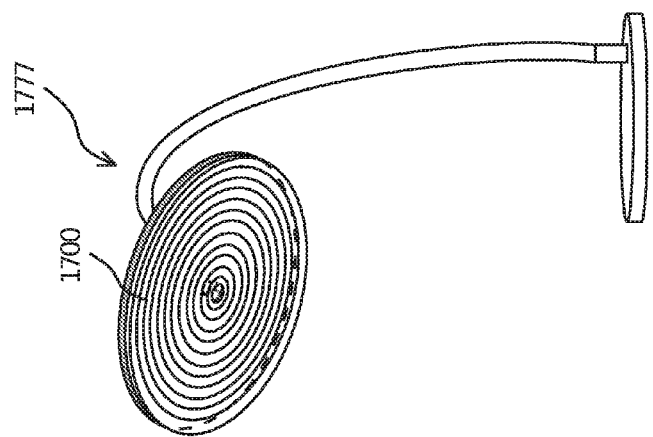
FIG. 25 is an illustration of a lamp employing an illumination device.

With reference to FIG. 25, an illumination device 1700 may be used in a luminaire such as a lamp 1777. The illumination device 1700 may be a circular disk such as that shown in FIG. 15 with the light source 102 disposed at the centre of the circular disk of the illumination device 1700. By providing a beam of light in this manner, use of the illumination device 1600 may reduce the amount of power required to illuminate a given area as compared to using a conventional luminaire.

Figure 26:
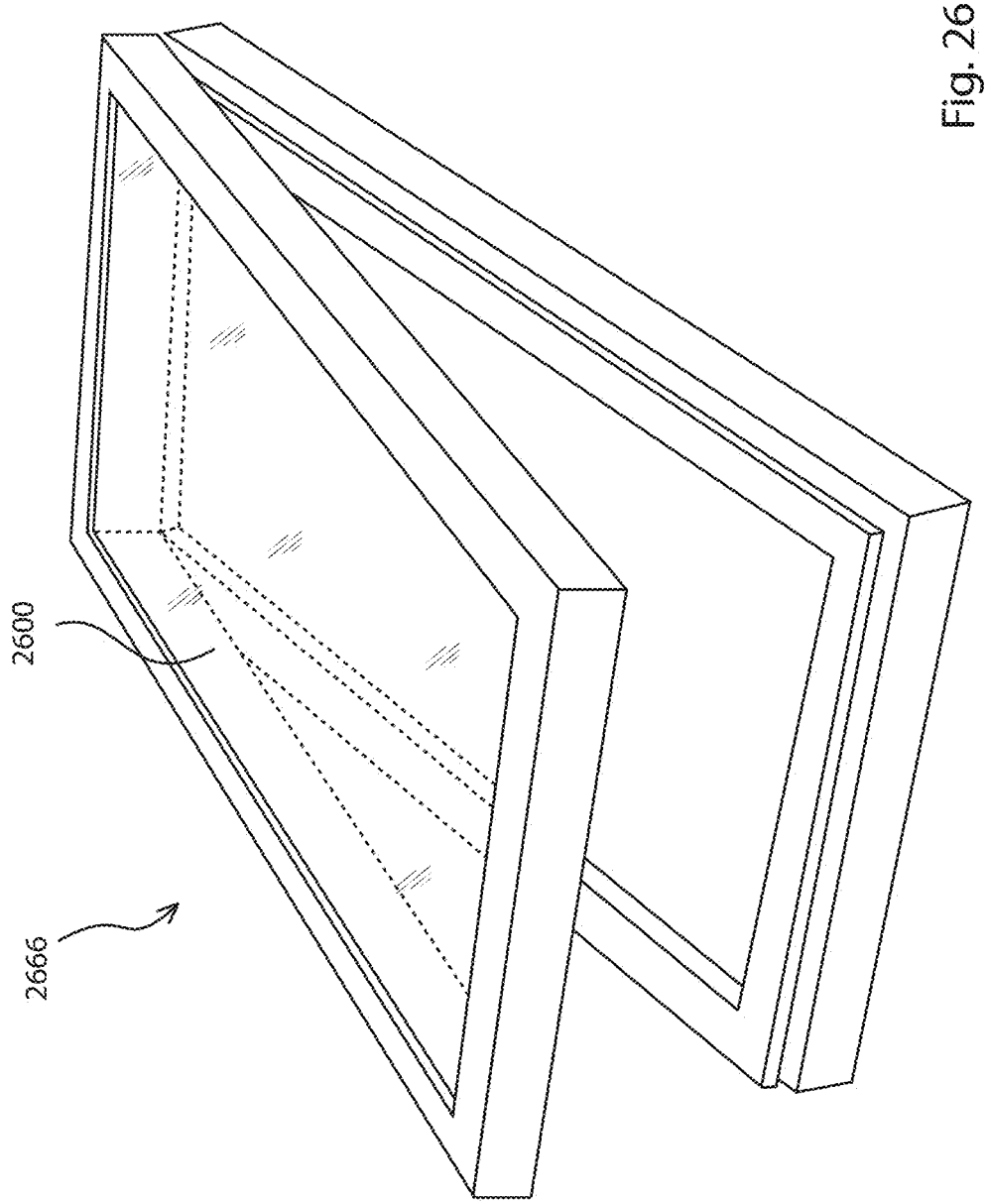
FIG. 26 is a perspective view of a window or skylight employing an illumination device.

As illustrated in FIG. 26, any of the illumination devices 2600 described above can be used as windows or skylights 2666 because they are made of translucent materials. In daylight, the window or skylight 2666 can transmit sunlight and when there is insufficient sunlight, the illumination device 2600 can be turned on to illuminate a space. Light source 102 could, for example, be an optical fibre optically coupled to a corner of the optic of the illumination device 2600.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

What is claimed is:

1. An optic for use with a light source in an illumination device, the optic comprising:
    a light guide made of light transmissive material, the light guide comprising
        a first surface;
        a second surface opposite the first surface;
        a light coupling area for receiving light from the light source; and
        a peripheral edge;
    a redirecting layer made of light transmissive material, the redirecting layer comprising a plurality of lenses in optical communication with the light guide for emitting light, the redirecting layer being optically attached to the first surface of the light guide; and
    a plurality of reflector elements adjacent and optically connected to the second surface of the light guide, each reflector element being associated with a lens of the redirecting layer for ejecting light entering the reflector element from the light guide toward the associated lens, wherein each of the reflector elements comprises an inter-step portion to receive light from the light guide, a first portion to reflect light towards the associated lens, and a second portion to reflect light from the inter-step portion to the first portion;
    the reflector elements comprising a light transmissive material of lower refractive index than the material of the light guide, the reflector elements being arranged such that said material is adjacent to the light guide.

2. The optic of claim 1 where the light guide is made from a material selected from the group of glass, polycarbonate, injection molded poly(methyl methacrylate) (PMMA), injection molded polymethyl methacrylimide (PMMI), cyclo olefin polymers (COP), cyclo olefin copolymers (COC), and silicone.

3. The optic of claim 1 where the first surface is a planar surface.

4. The optic of claim 1 where the plurality of lenses of the redirecting layer is planocovenx lenses that are adjacent to one another.

5. The optic of claim 1 where the redirecting layer is integrated or over molded with the first surface of the light guide.

6. The optic of claim 1 wherein the reflector elements comprise flat, parabolic analytical or free-form reflective surfaces.

7. The optic of claim 1 wherein light is totally internally reflected by the first surface of the light guide and a step portion of the second surface of the light guide.

8. The optic of claim 1 wherein the first surface of the light guide is sloped relative to the light emitting surface of the redirecting layer and the redirecting layer is wedged-shape in cross-section so that the combined thickness of the redirecting layer and light guide is substantially constant.

9. The optic of claim 1 further comprising an optical coupling layer between the redirecting layer and the light guide, wherein the optical coupling layer is made from a heat-deformable, optically transmissive material and the redirecting layer and the light guide are fused together into a monolithic optic.

10. The optic of claim 1 further comprising a low refractive index film between a reflector element and the light guide whereby light entering the reflective element via the inter-step portion and reflected by the second portion of the reflective surface of the reflector element undergoes total internal reflection at the interface of the low refractive index film and the reflector element.

11. The optic of claim 1 wherein the second portion of the reflector element comprises a protrusion extending from a substantially flat portion whereby light from the light guide passes through an optical aperture formed by the protrusion and the reflector element.

12. The optic of claim 1 wherein the redirecting layer comprises a plurality of concavo-convex lenses; and the second surface of the optic is stepped.

13. An illumination device comprising
    an optic of claim 1;
    a light source coupled to the light coupling area of the optic.

14. The illumination device of claim 13 wherein the illumination has a circulate symmetry about a central axis passing through the light source for the optic.

15. The illumination device of claim 13 wherein the illumination device is planar cuboid has a linear light source and plane of symmetry about the light source.

16. An optic for use with a light source in an illumination device, the optic comprising:
    an array of redirecting lenses and associated reflector elements;
    a light guide made of light transmissive material having a first surface optically attached to the redirecting lenses and a second substantially parallel surface optically attached to the reflector elements, the light transmissive material of the light guide having a higher index of refraction than a light transmissive material present in at least one of the redirecting lenses and the reflector elements;
    a light conditioning element for receiving light from a light source for distributing light within the light guide;
    each of the reflector elements comprising an inter-step portion for receiving light from the light guide, a first portion for reflecting light towards the associated lens, and a second portion for reflecting light from the inter-step portion to the first portion;
    the redirecting lenses transmitting received light to the exterior of the optic.

17. The optic of claim 16 wherein the redirecting lenses and the reflector elements are integrally formed with the light guide.

* * * * *